(12) United States Patent
Oyama et al.

(10) Patent No.: US 10,631,449 B2
(45) Date of Patent: Apr. 21, 2020

(54) TAPE PROCESSING METHOD AND TAPE REPAIR MEMBER

(71) Applicant: YAMAHA HATSUDOKI KABUSHIKI KAISHA, Iwata-shi, Shizuoka-ken (JP)

(72) Inventors: Kazuyoshi Oyama, Shizuoka (JP); Kazuhiro Nagao, Shizuoka (JP); Koji Yamazumi, Shizuoka (JP)

(73) Assignee: YAMAHA HATSUDOKI KABUSHIKI KAISHA, Iwata-shi, Shizuoka-ken (JP)

(*) Notice: Subject to any disclaimer, the term of this patent is extended or adjusted under 35 U.S.C. 154(b) by 105 days.

(21) Appl. No.: 15/764,764

(22) PCT Filed: Oct. 1, 2015

(86) PCT No.: PCT/JP2015/077996
§ 371 (c)(1),
(2) Date: Mar. 29, 2018

(87) PCT Pub. No.: WO2017/056303
PCT Pub. Date: Apr. 6, 2017

(65) Prior Publication Data
US 2018/0279519 A1 Sep. 27, 2018

(51) Int. Cl.
*H05K 13/02* (2006.01)
*H05K 13/00* (2006.01)

(52) U.S. Cl.
CPC ............. *H05K 13/02* (2013.01); *H05K 13/00* (2013.01); *H05K 13/0084* (2013.01); *H05K 13/0215* (2018.08)

(58) Field of Classification Search
CPC ........ H05K 13/00; H05K 13/02; H05K 13/04; H05K 13/0417; H05K 13/0419
(Continued)

(56) References Cited

U.S. PATENT DOCUMENTS

| 4,820,369 A | * | 4/1989 | Kubo | ................. H05K 13/0419 |
| | | | | 156/716 |
| 6,082,603 A | * | 7/2000 | Takada | ............... H05K 13/0417 |
| | | | | 226/157 |

(Continued)

FOREIGN PATENT DOCUMENTS

| JP | H04-022196 A | 1/1992 |
| JP | 2015-053320 A | 3/2015 |
| WO | 2014/016980 A1 | 1/2014 |

OTHER PUBLICATIONS

International Search Report issued in PCT/JP2015/077996; dated Dec. 8, 2015.

*Primary Examiner* — Christopher M Koehler
(74) *Attorney, Agent, or Firm* — Studebaker & Brackett PC

(57) ABSTRACT

A tape processing method of reusing an opened component supplying tape used in a tape feeder which conveys the component supplying tape provided with a carrier tape including a plurality of component storing portions and a cover tape toward a component take out position, the tape feeder being configured to open a cover tape and convey the component supplying tape. The method includes steps of: repairing the component supplying tape by closing an opened portion of the cover tape and fixing by a repair tape to be returned to a state in which the component storing portion is covered by the cover tape; and cutting the component supplying tape at a predetermined cut position far away toward a downstream side in the conveying direction from a position of a head component located at the most downstream side in the conveying direction.

9 Claims, 19 Drawing Sheets

(58) Field of Classification Search
USPC .................................................... 29/402.09
See application file for complete search history.

(56) References Cited

U.S. PATENT DOCUMENTS

| | | | |
|---|---|---|---|
| 6,659,705 B1 | 12/2003 | Reinnagel et al. | |
| 2004/0094451 A1* | 5/2004 | Saho | H05K 13/0417 206/714 |
| 2008/0314793 A1* | 12/2008 | Davis | B65D 5/327 206/714 |
| 2015/0195963 A1 | 7/2015 | Kitani et al. | |
| 2015/0195964 A1* | 7/2015 | Yamasaki | H05K 13/0419 226/76 |
| 2015/0351294 A1* | 12/2015 | Yamasaki | H05K 13/0408 156/762 |
| 2018/0118387 A1* | 5/2018 | Eguchi | B65H 26/08 |

* cited by examiner

FIG. 10A
FIG. 10B
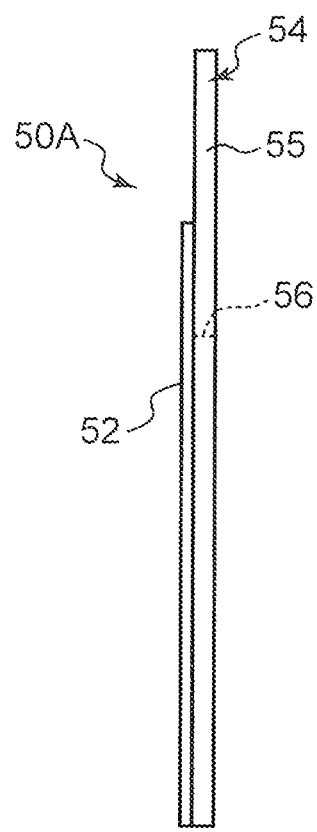
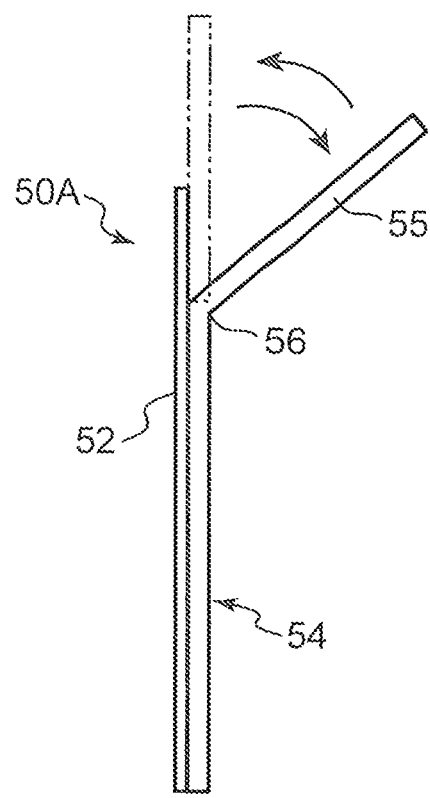

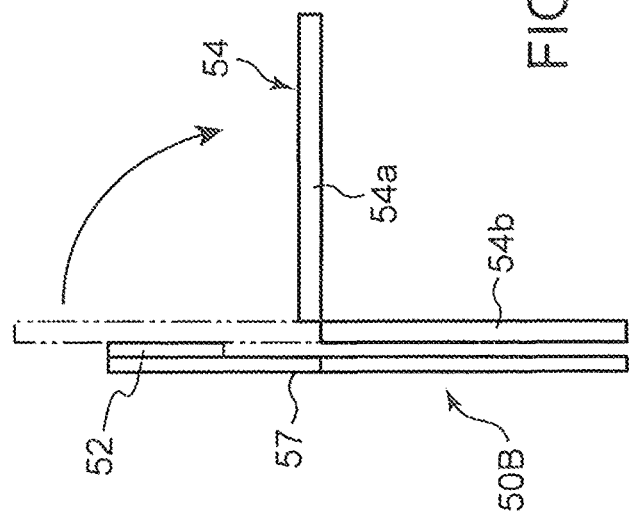
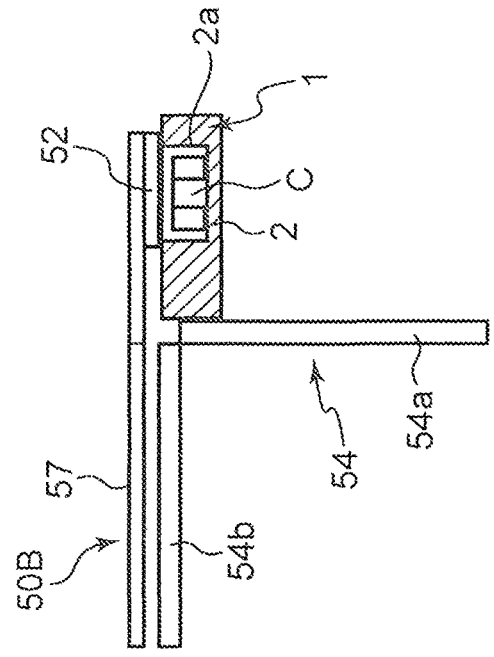
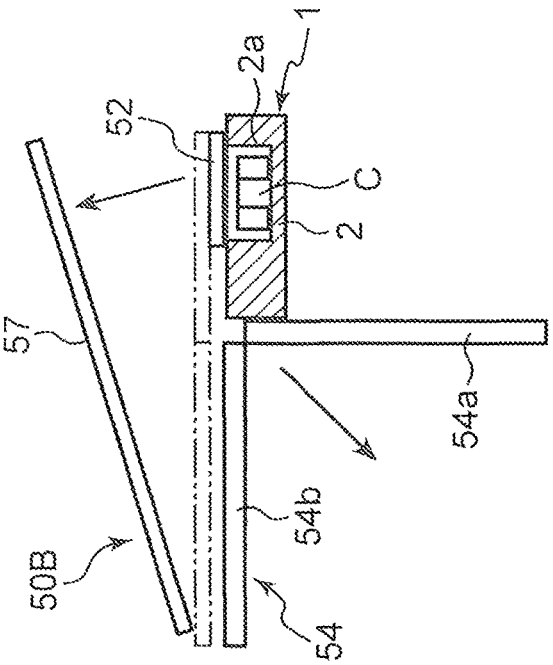
FIG. 12A
FIG. 12B
FIG. 12C

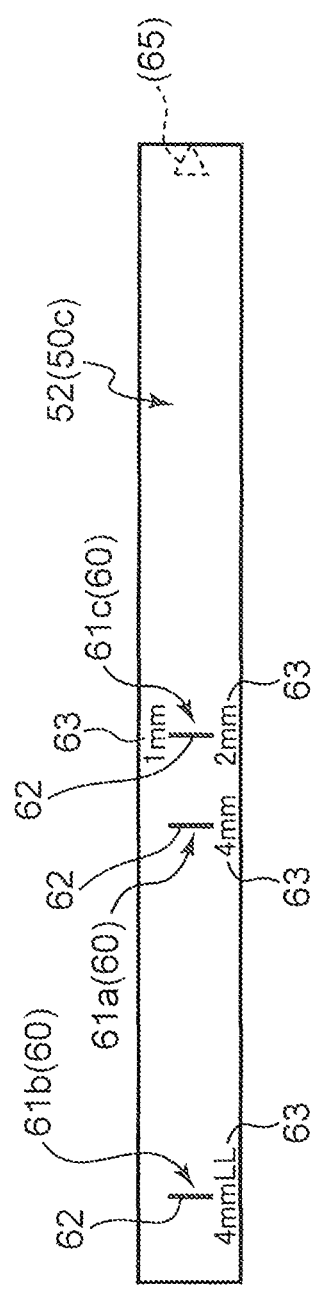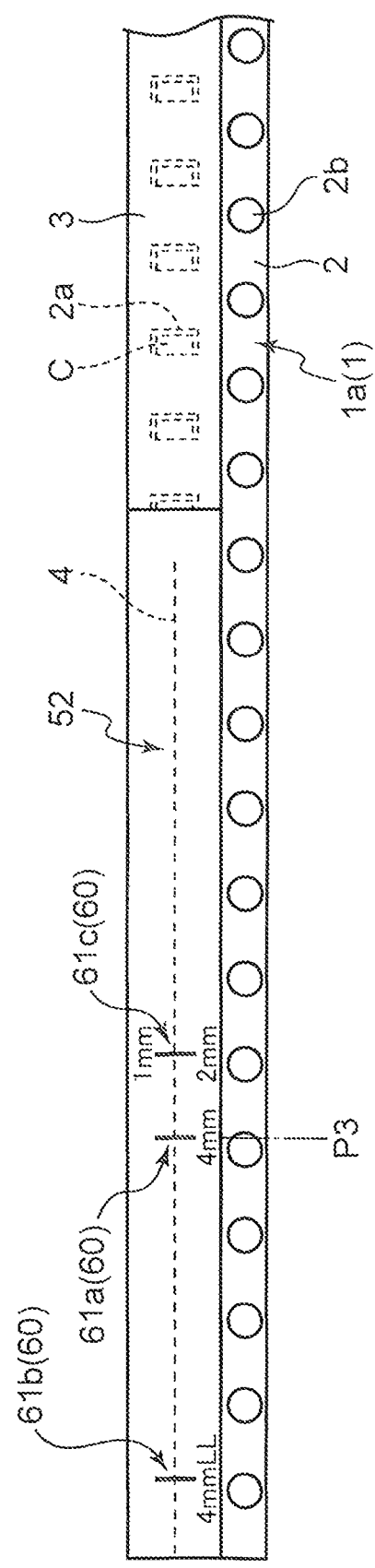

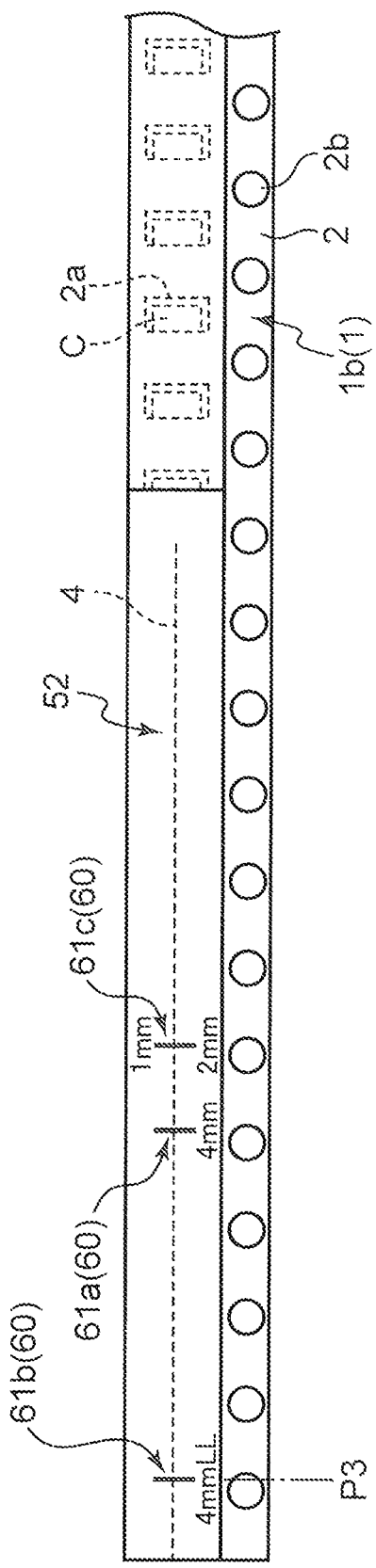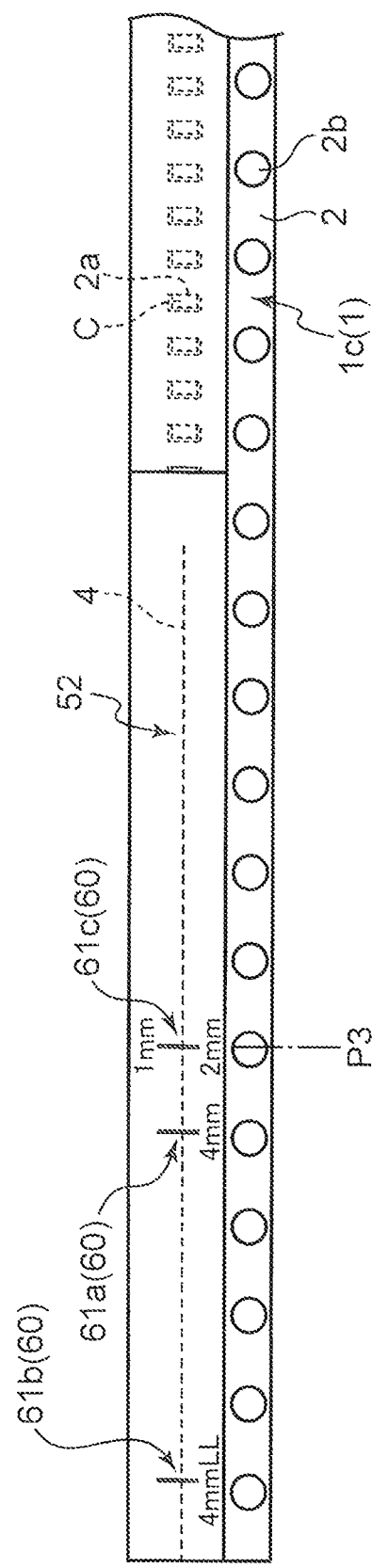

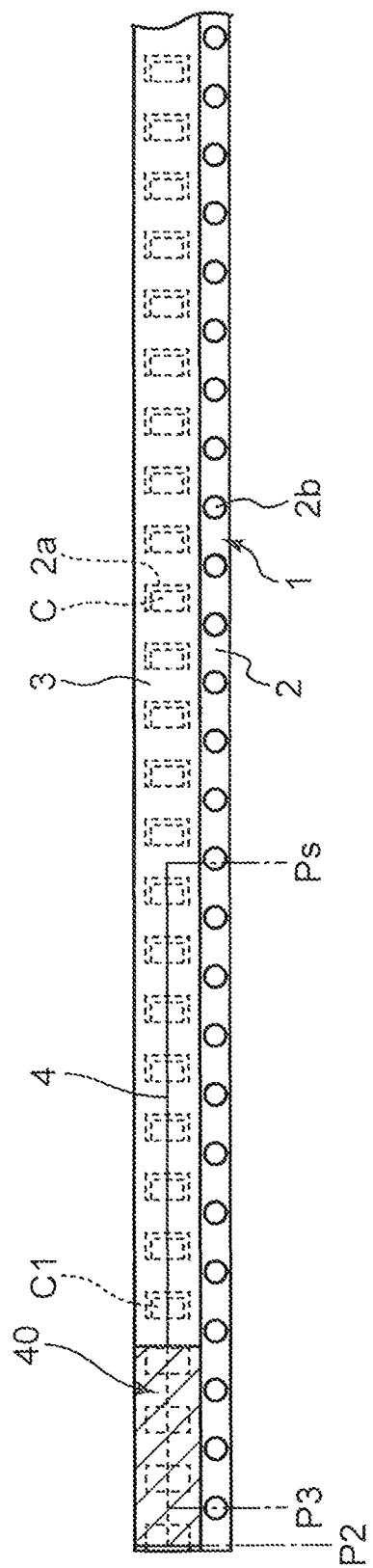

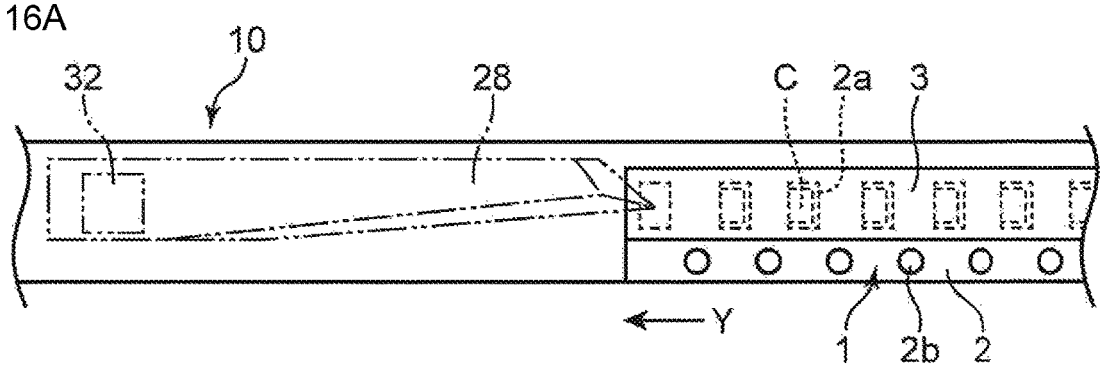
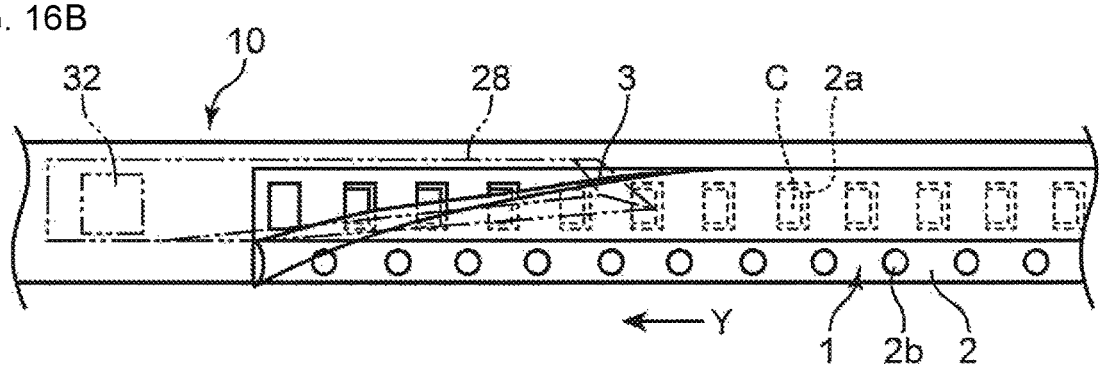
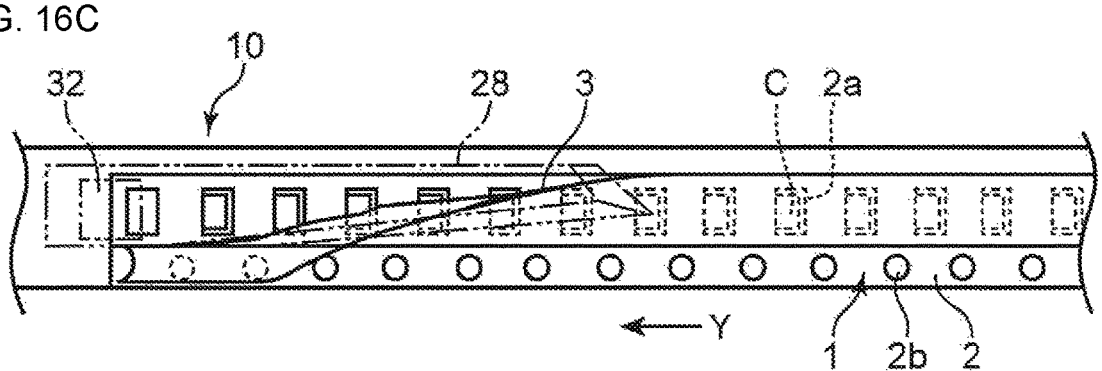

FIG. 18A 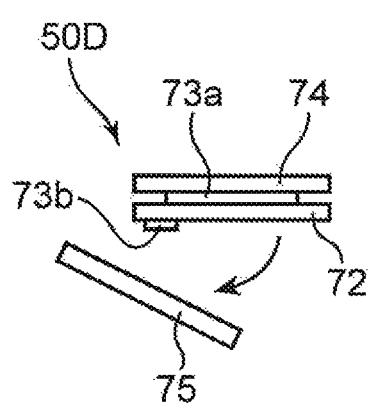 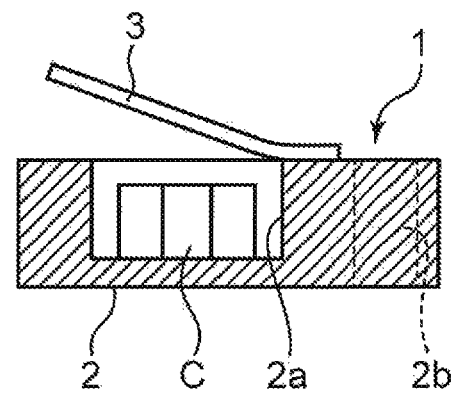

TAPE PROCESSING METHOD AND TAPE REPAIR MEMBER

CROSS-REFERENCE TO RELATED APPLICATION

This application claims benefit of priority to International Patent Application No. PCT/JP2015/077996, filed Oct. 1, 2015, the entire content of which is incorporated herein by reference.

BACKGROUND

Technical Field

The present disclosure relates to a tape processing method and a tape repair member for reusing a component supplying tape used in a tape feeder without wasting a component remained on the component supplying tape.

Background Art

Conventionally, as a component supplying device applied to a component mounting device, a tape feeder which supplies a component by using a tape as a carrier is known. The tape feeder is configured to supply a plurality of the components stored in a component supplying tape to a predetermined component take out position sequentially by drawing and conveying the component supplying tape wound on a reel.

The component supplying tape includes a carrier tape in which a plurality of recess portions (a component storing portion) for storing the component is formed, and a cover tape adhered to the carrier tape to cover the components. The tape feeder is configured to open the component storing portion at the component take out position by peeling the cover tape from the carrier tape in conveying of the component supplying tape.

In recent years, a tape feeder for a next generation, which is disclosed in JP 2015-53320 A, has been developed. The tape feeder is configured such that the cover tape is cut open along a longitudinal direction at a center in a width direction of the cover tape and is expanded toward both sides in conveying of the component supplying tape so that the component storing portion is opened. That is, the tape feeder is configured to open the component storing portion without peeling the cover tape from the carrier tape (while keeping an adhering state of the cover tape to the carrier tape). According to this configuration, since a peeling mechanism for the cover tape is not necessary, the configuration of the tape feeder can be simplified and manufactured in a low cost. Further, the cover tape and the carrier tape are recovered as an integrated state, and therefore workability of recovery operation and disposal operation of the used tape can be improved.

In the tape feeder disclosed in JP 2015-53320 A, it is necessary to expand a cut open portion of the cover tape sufficiently toward both sides of the component supplying position in order to expose the component firmly. Thus, the cutting open of the cover tape is started at a position sufficiently far away toward an upstream side (an upstream side in a conveying direction of the component supplying tape) from the component take out position. Accordingly, the following problem is generated. That is, several components are arranged in a section in the component supplying tape between a cut open start position and a component supplying position of the cover tape, and when the reel is replaced due to change of the component (change of an arrangement of the component), the component supplying tape is stored until the component supplying tape is used at the next time after cutting off all the section in which the cover tape is cut open. This is performed to prevent the component from dropping off from the cut open portion of the cover tape when stored or used at the next time so that occurrence of supply failure in the tape feeder is avoided. However, relatively many components are wasted due to such management of the component supplying tape in replacing the reel. This problem is similarly generated in the tape feeder in which the cover tape is opened from one side in conveying, namely in which the component supplying portion is opened by peeling one side of the cover tape in the width direction, in addition to the tape feeder in which the cover tape is cut open as disclosed in JP 2015-53320 A.

SUMMARY

An object of the present disclosure is to provide a useful technique for reusing a component supplying tape used in a tape feeder without wasting a component remained on the component supplying tape.

The present disclosure includes a tape processing method of reusing an opened component supplying tape used in a tape feeder which conveys the component supplying tape having a strip shape and provided with a carrier tape including a plurality of component storing portions in which a component is stored in a row and a cover tape adhered to the carrier tape to cover the component storing portion, toward a component take out position, the tape feeder being configured to open a cover tape at a position far away toward an upstream side from the component take out position in a conveying direction while keeping an adhering state of the cover tape to the carrier tape and conveying the component supplying tape. The tape processing method of reusing the opened component supplying tape includes steps of repairing the component supplying tape by closing an opened portion of the cover tape and fixing by a repair tape to be returned to a state in which the component storing portion is covered by the cover tape, and cutting the component supplying tape at a predetermined cut position far away toward a downstream side in the conveying direction from a position of a head component located at the most downstream side in the conveying direction.

BRIEF DESCRIPTION OF THE DRAWINGS

FIG. 10A is a side view of the tape repair member;

FIG. 10B is a side view of the tape repair member in a state in which a sheet like member is folded along a folded portion;

FIG. 12A is a view for describing a usage method of the tape repair member (a side view of the tape repair member illustrating a state in which the sheet like member is folded along the folded portion)

FIG. 12B is a view for describing a usage method of the tape repair member (a side view of the tape repair member illustrating a state in which the repair sheet is adhered to the component supplying tape);

FIG. 12C is a view for describing a usage method of the tape repair member (a side view of the tape repair member illustrating a state in which a protection sheet and the sheet like member are removed);

FIG. 13A is a plan view illustrating a repair tape of a tape repair member (third embodiment);

FIG. 13B is a plan view illustrating a standard size tape to which the repair tape is adhered;

FIG. 14A is a plan view illustrating a large size tape to which the repair tape is adhered;

FIG. 14B is a plan view illustrating a small size tape to which the repair tape is adhered;

FIG. 15 is a plan view illustrating one example of the component supplying tape to which the repair tape is adhered;

FIGS. 16A to 16C are plan views of the component supplying tape illustrating an opening state of the cover tape in time series;

FIG. 18A is a view for describing a usage method of the tape repair member (a cross-sectional view of the component supplying tape illustrating a state in which a rear side sheet like member is peeled from the repair tape);

DESCRIPTION OF EMBODIMENTS

At first, a configuration of a component mounting device and a configuration of a tape feeder applied to the component mounting device will be described before describing the present disclosure in detail.

Figure 1:
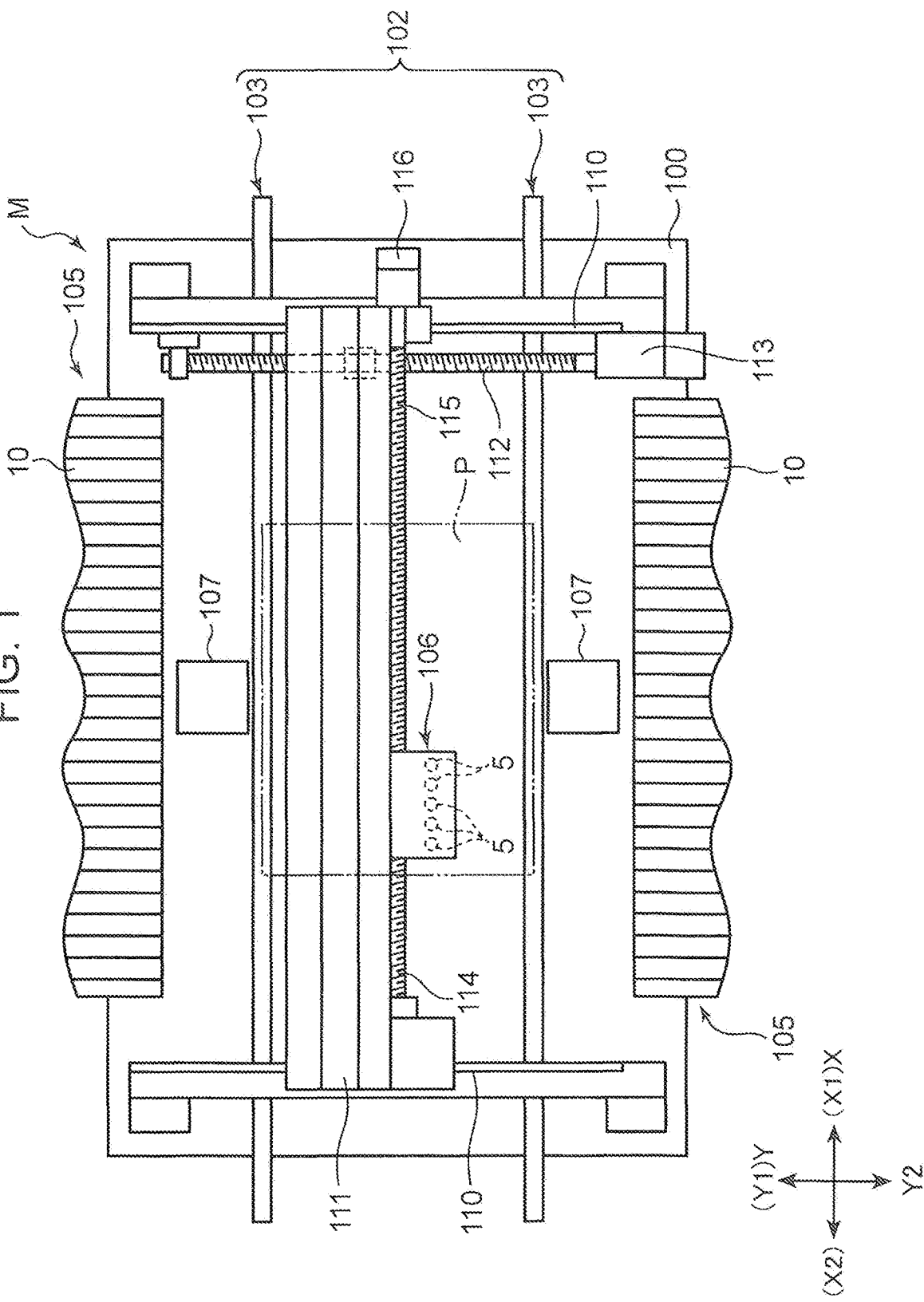
FIG. 1 is a plan view illustrating a whole configuration of a component mounting device.

FIG. 1 is a plan view of the component mounting device. In the figure, the XY coordinate is shown in order to clarify a directional relationship. The X direction is parallel to a horizontal plane, and the Y direction is perpendicular to the X direction on the horizontal plane.

A component mounting device M shown in FIG. 1 includes a base 100, a substrate conveying mechanism 102 which conveys a substrate P such as a print circuit board on the base 100, component supplying portions 105, a head unit 106, a head unit driving mechanism which drives the head unit 106, and a component recognition camera 107.

The substrate conveying mechanism 102 includes a pair of belt conveyers 103 which conveys the substrate P. The substrate conveying mechanism 102 receives the substrate P from a right side of FIG. 1 (a side of the X1 direction) to convey the substrate P to a predetermined mounting operation position (a position shown in FIG. 1) and then carries out the substrate P to a left side of FIG. 1 (a side of the X2 direction) after the mounting operation.

The component supplying portions 105 are arranged at both sides of the substrate conveying mechanism 102 (both sides in the Y direction). A plurality of tape feeders 10 is arranged along the conveyer 103 in each of the component supplying portion 105. Each of the tape feeders 10 is configured to supply a chip component (hereinafter, referred to as a component) formed in a small piece such as an IC, a transistor, and a condenser by using a tape as a carrying body (carrier).

The head unit 106 is configured to take out a component from each of the component supplying portions 105 so as to mount the component on the substrate P. The head unit 106 is arranged to be movable within a certain region by the head unit driving mechanism. Specifically, the head unit driving mechanism includes a pair of fixing rails 110 each of which is fixed to an overhead frame and is extended in the Y direction, a unit supporting member 111 supported by the fixing rails 110 in a movable manner and extended in the X direction, and a ball screw shaft 112 screwed into the unit supporting member 111 and driven by a Y axis servo motor 113. Further, the head unit driving mechanism includes a fixing rail 114 which is fixed to the unit supporting member 111 and which supports the head unit 106 in a movable manner in the X direction, and a ball screw shaft 115 which is screwed into the head unit 106 and is driven by an X axis servo motor 116 configured as a driving source. That is, the head unit driving mechanism is configured to move the head unit 106 in the X direction by using the X axis servo motor 116 via the ball screw shaft 115 and is configured to move the unit supporting member 111 in the Y direction by using the Y axis servo motor 113 via the ball screw shaft 112. As a result, the head unit 106 is moved in the X direction and the Y direction within the certain region.

The head unit 106 includes a plurality of heads 5 having a shaft like shape, and a head driving mechanism which drives the heads 5. In this example, the head unit 106 includes five heads 5 aligned in a line in the X direction.

Although the illustration is omitted, the head driving mechanism includes an elevating driving mechanism which elevates each of the heads 5 independently by using the servo motor as a driving source, and a rotating driving mechanism which includes a single servo motor commonly used for the heads 5 and rotates each of the heads 5 around the center axis of the head (R direction) at the same time.

A tip portion of each of the heads 5 includes a nozzle for sucking the component. The nozzle of each of the heads 5 can be selectively communicated with either of a negative pressure generation device, a positive pressure generation device and atmospheric air via an electrically operated switching valve. That is, when the negative pressure is provided to the nozzle, the component is sucked and held, and then when the positive pressure is provided to the nozzle, the sucking and the holding of the component are cancelled.

The component recognition camera 107 is configured to take images from a lower side of the component in order to recognize a sucking state of the component taken out from the component supplying portion 105 by each of the heads 5. Each of the component recognition cameras 107 is arranged between each of the component supplying portions 105 and the substrate conveying mechanism 102 on the base 100.

Figure 2:
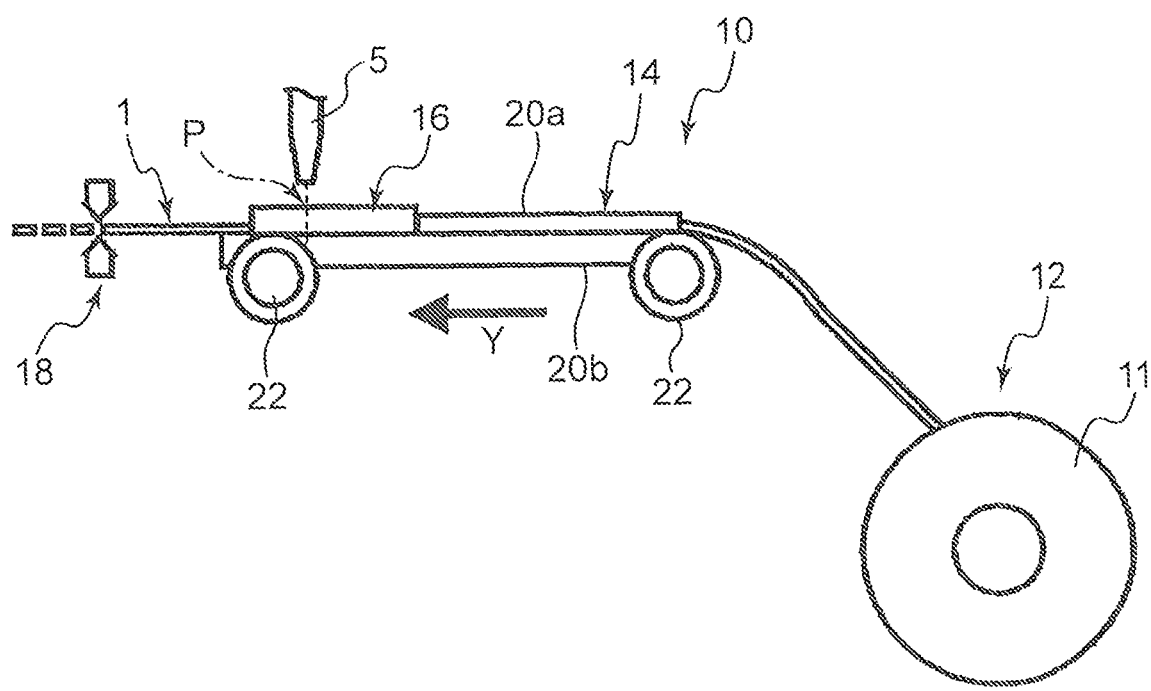
FIG. 2 is a side view illustrating a whole configuration of a tape feeder.

FIG. 2 is a side view schematically illustrating a whole configuration of the tape feeder 10. As described above, the tape feeder 10 is configured to supply a component formed in a small piece such as an IC, a transistor, and a condenser by using a tape as a carrier to mount the component on the substrate.

The tape feeder 10 includes a tape holder 12 which holds a reel 11 on which the component supplying tape 1 having a strip shape and storing the components is wound, a conveying device 14 which conveys the component supplying tape 1 toward a predetermined component take out position P while drawing the component supplying tape 1 from the reel 11 held by the tape holder 12, an opening device 16 which opens a cover tape 3 described below of the component supplying tape 1 conveyed by the conveying device 14, and a cutting device 18 which cuts the component supplying tape 1 after the component is taken out (empty tape).

Figure 3:
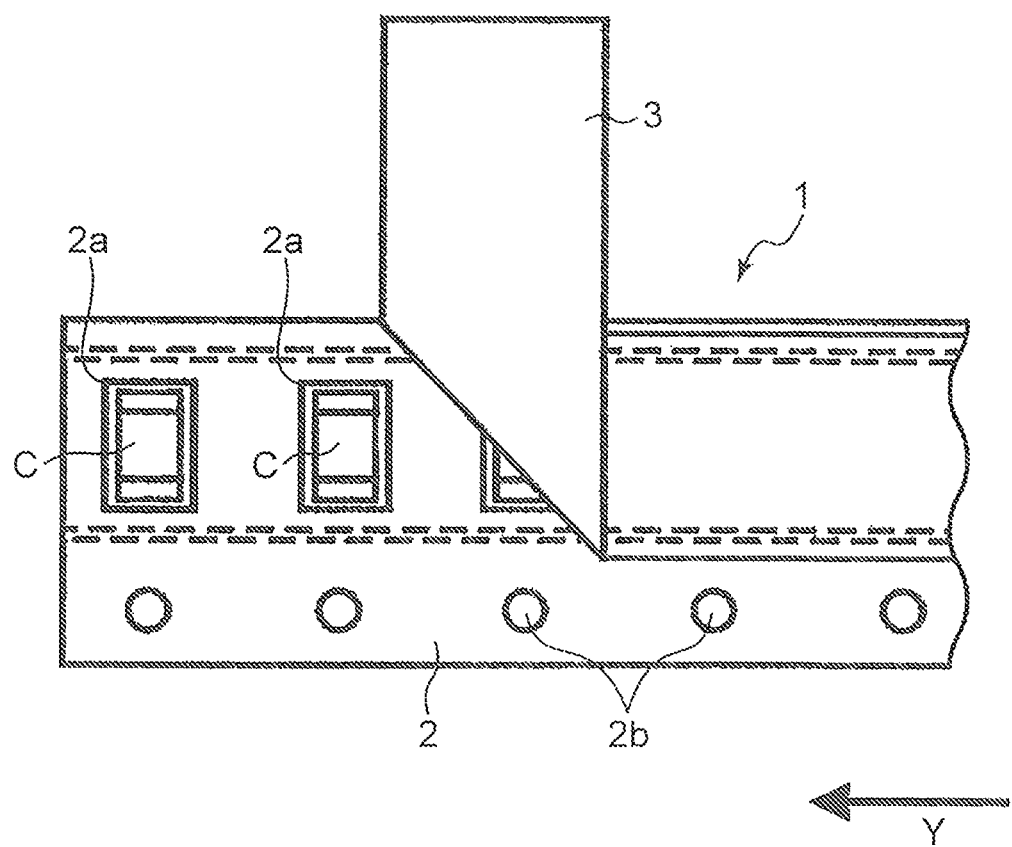
FIG. 3 is a plan view illustrating a component supplying tape.

As shown in FIG. 3, the component supplying tape 1 is configured by a carrier tape 2 having a strip shape, and the cover tape 3 having a strip shape and adhered to the carrier tape 2.

The carrier tape 2 is formed of resin material such as polystyrene and polycarbonate having flexibility. The carrier tape 2 includes a plurality of component storing portions 2a aligned in a longitudinal direction (a lateral direction in FIG. 3) at the same interval, and a plurality of feeding holes 2b aligned in the longitudinal direction at the same interval.

The component storing portion 2a is formed by a recess portion having a rectangular shape in a plan view, the recess portion being formed on the carrier tape 2 and opened upward. A component C having a rectangular shape in a plan view is stored in each of the component storing portions 2a. The feeding hole 2b is formed by a through hole formed in the carrier tape 2 with which a sprocket 22 described below of the conveying device 14 is engaged so as to feed the component supplying tape 1. As shown in FIG. 3, the feeding hole 2b is offset from the component storing portion 2a in a width direction (a vertical direction in FIG. 3). Here, the component storing portion 2a and the feeding hole 2b are arranged at a predetermined standardized positional relationship.

The cover tape 3 is formed by a transparent resin film formed of polystyrene or polycarbonate. The cover tape 3 is adhered on an upper surface of the carrier tape 2 over the whole length of the carrier tape 2 so as to cover the component storing portion 2a from an upper side. A width of the cover tape 3 is set to be appropriately larger than a width of the component storing portion 2a and is adhered to the upper surface of the carrier tape 2 so that only a region in which the component storing portion 2a is formed in the carrier tape 2 is covered by the cover tape 3 (namely, the feeding hole 2b is not covered). Further, only both end portions of the cover tape 3 in the width direction are adhered to carrier tape 2 by means of welding.

The conveying device 14 includes an upper guide 20a and a lower guide 20b which guide the component supplying tape 1 horizontally along the longitudinal direction thereof, a pair of the sprockets 22 engaged with the feeding hole 2b at mutually different positions in the longitudinal direction of the component supplying tape 1 guided by the guides 20a, 20b, a servo motor not shown which rotationally drives the sprockets 22, and the like. That is, the conveying device 14 conveys the component supplying tape 1 toward the component take out position P along the guides 20a, 20b, by rotationally driving each of the carrier tape 2 by using the servo motor. Further, "an upstream side" and "a downstream side" described below are based on a conveying direction Y of the component supplying tape 1 in the tape feeder 10.

The opening device 16 is arranged at the downstream side of the upper guide 20a and above the lower guide 20b. The opening device 16 opens the cover tape 3 of the component supplying tape 1, which is conveyed along the guides 20a, 20b, at a position far away from the component take out position P toward the upstream side. In this example, the opening device 16 opens the cover tape 3 by cutting open the cover tape 3.

Figure 4:
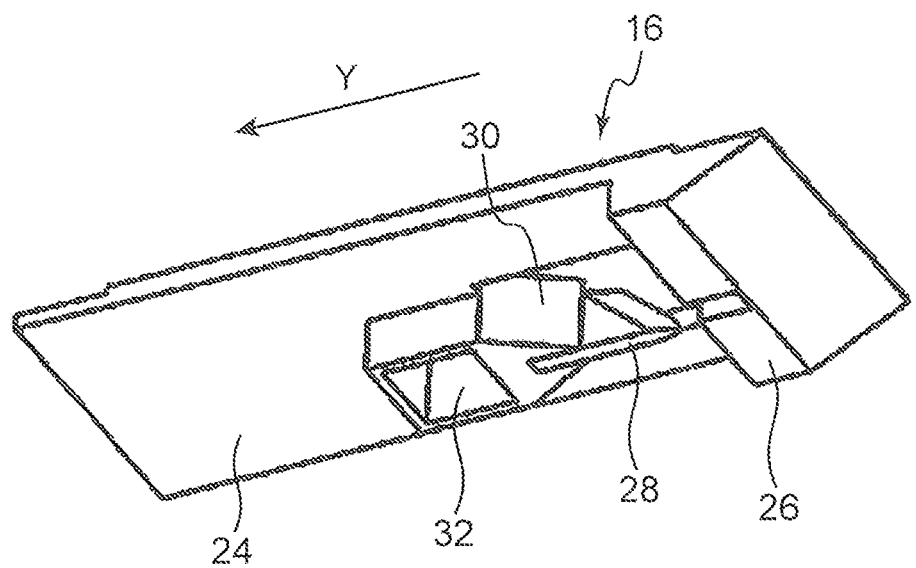
FIG. 4 is a perspective view illustrating an opening device.
Figure 5A:
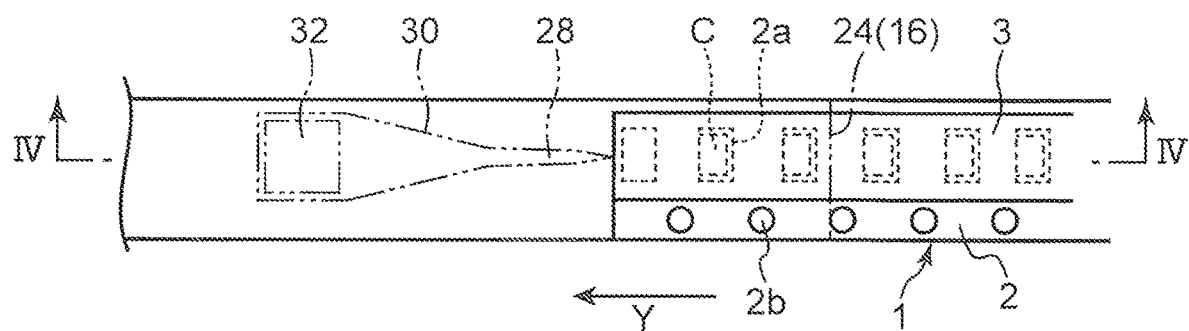
FIG. 5A is a plan view illustrating a relationship between the opening device and the component supplying tape.
Figure 5B:
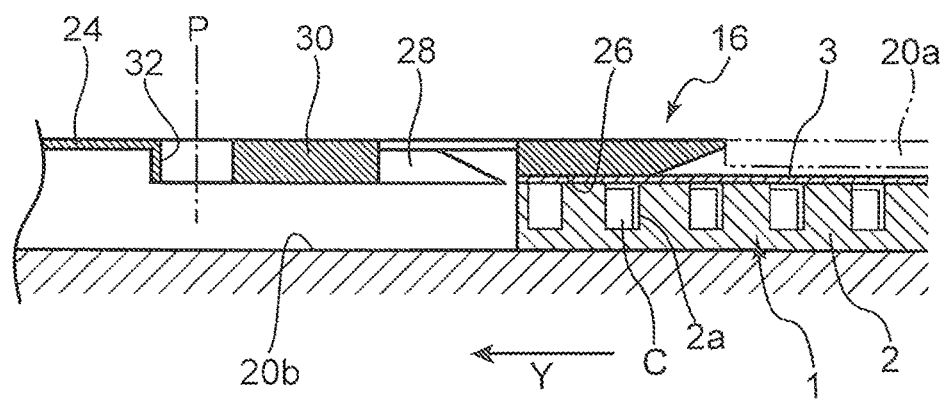
FIG. 5B is a vertical cross-sectional view of a tape feeder (a cross-sectional view taken along line IV-IV in FIG. 5A)

Specifically, as shown in FIG. 4 and FIGS. 5A and 5B, the opening device 16 includes a main portion 24 having a plate shape formed in a rectangular shape in a plan view, a positioning guide portion 26, a cutter 28, and a russel portion (expanding portion) 30 arranged below the main portion 24. The positioning guide portion 26, the cutter 28 and the expanding portion 30 are arranged in this order from the upstream side.

The positioning guide portion 26 positions the component supplying tape 1 together with the lower guide 20b in the vertical direction by contacting the component supplying tape 1, which is conveyed along the guides 20a, 20b, from the upper side. The cutter 28 cuts the cover tape 3 of the component supplying tape 1 along the longitudinal direction thereof. The expanding portion 30 expands the cover tape 3 cut by the cutter 28. With this configuration, as shown in FIGS. 6A to 6D, the opening device 16 cuts open the cover tape 3 in accordance with the conveying of the component supplying tape 1. Further, in FIG. 5A and FIG. 6A, the cutter 28, the expanding portion 30, and the like are illustrated by a virtual line (a double dashed line), and in FIGS. 6A to 6D, the illustration of the cutter 28, the expanding portion 30, and the like is omitted for the sake of convenience.

Further, as shown in FIG. 5A, the cutter 28 is arranged at the center of the component storing portion 2a in the width direction. The expanding portion 30 has an outline of a triangular shape in a plan view symmetry in the width direction with respect to the position of the cutter 28 as the center. With this, the opening device 16 can expand the cover tape 3 symmetrically outward in the width direction from the cut position while cutting the cover tape 3 at the center of the component storing portion 2a in the width direction. That is, the opening device 16 opens the cover tape 3 while keeping the adhering state of the cover tape 3 to the carrier tape 2.

The opening device 16 further includes a component take out hole 32 for taking out the component C from the component supplying tape 1. As shown in FIG. 4 and FIG. 5B, the component take out hole 32 is a through hole having a square cross section penetrating the main portion 24 in the vertical direction, the component take out hole 32 being formed adjacent to the expanding portion 30 at the downstream side of the expanding portion 30. That is, the center of the component take out hole 32 corresponds to the component take out position P, and the component C stored in the component storing portion 2a is taken out from the component supplying tape 1 through the component take out hole 32. Specifically, the head 5 (see FIG. 2) installed in the component mounting device sucks the component C by means of the negative pressure through the component take out hole 32 while moving up and down, and thereby the component C is taken out from the component supplying tape 1.

The cutting device 18 cuts the component supplying tape 1 into a certain size after the component C is taken out (empty tape). The cutting device 18 is arranged at a position far away from the component take out position P toward the downstream side. With this, the empty tape is recovered in a predetermined recovery box while being cut into small pieces.

As described above, the tape feeder 10 cuts open the cover tape 3 by using the opening device 16 while conveying the component supplying tape 1 by using the conveying device 14 so as to supply the component C to the head 5 through the opening portion of the cover tape 3 cut open in such a way.

Figure 6A:
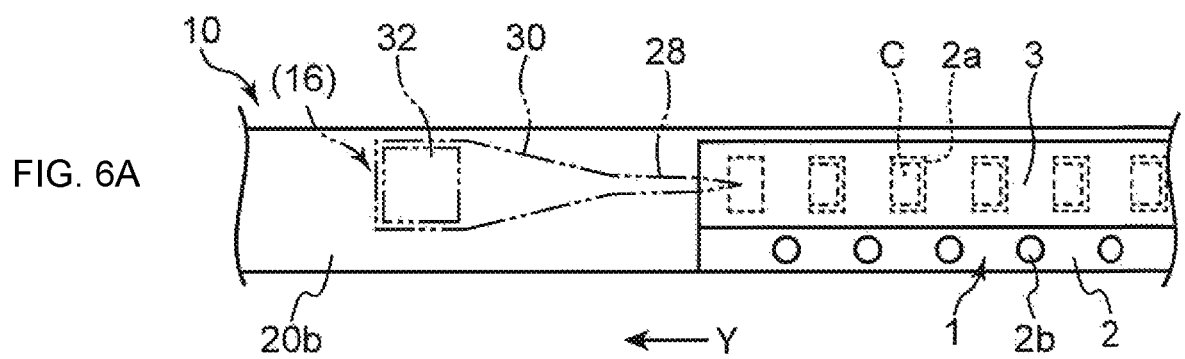
FIGS. 6A to 6D are plan views of the component supplying tape illustrating an opening state of the cover tape in time series.
Figure 6B:
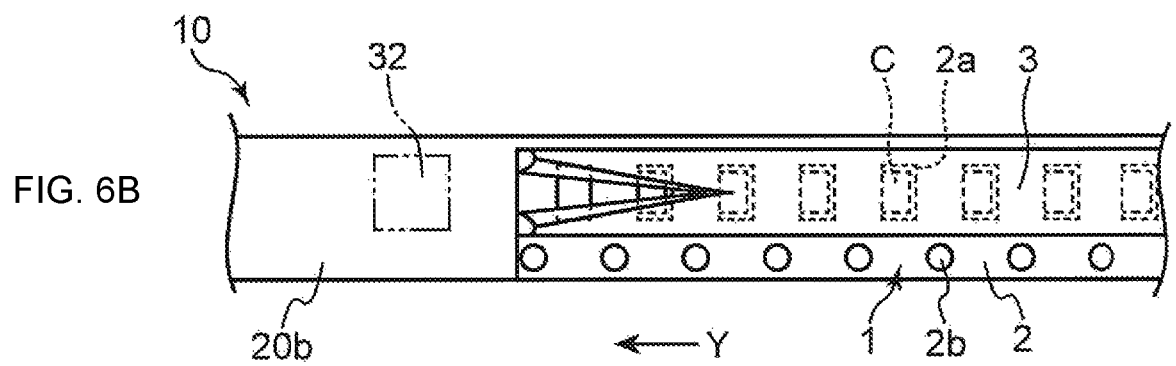
Figure 6C:
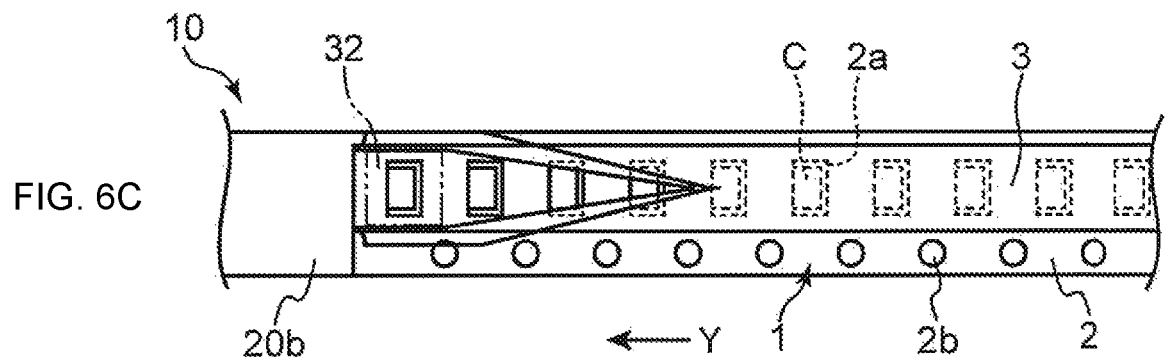
Figure 6D:
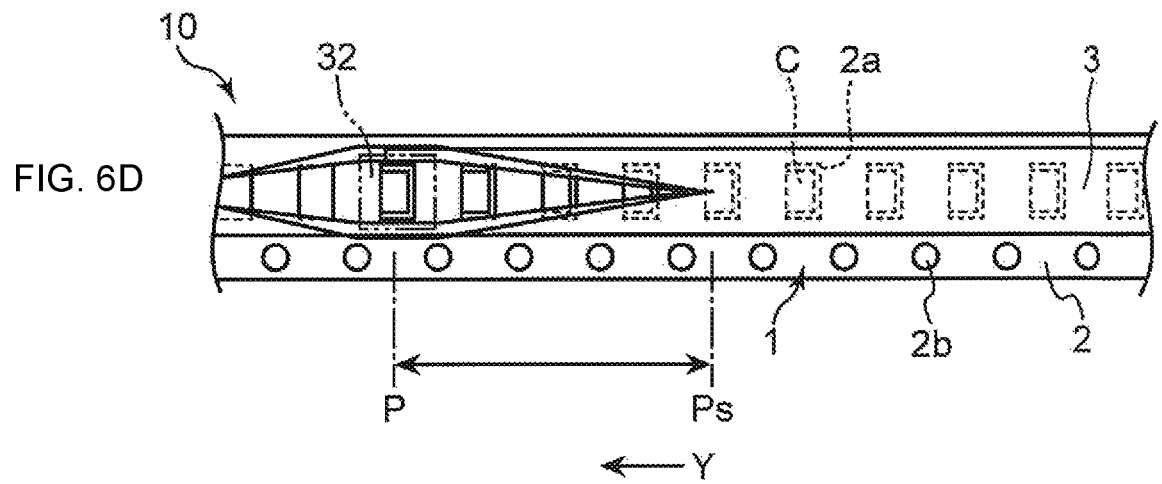

As shown in FIG. 6D, in the tape feeder 10 as described above, the cover tape 3 of the component supplying tape 1 is cut open at the position far away from the component take out position P (the component take out hole 32) toward the upstream side. Thus, several components C exist in a section in the component supplying tape 1 between a cutting (opening) start position Ps and the component take out position P of the cover tape 3, however when the reel is replaced due to change of the component (change of an arrangement of the component), all the section in which the cover tape 3 is cut open is cut off and then the component supplying tape 1 is stored until the component supplying tape 1 is used at the next time. This is performed to prevent the component C from dropping off from the cut open portion of the cover tape 3 when the component supplying tape 1 is stored or used at the next time so that occurrence of supply failure of the tape feeder 10 is avoided. However, relatively many components are wasted due to such management of the component supplying tape 1 when the reel is replaced.

Such a problem can be solved by adopting a tape processing method according to the present disclosure described below.

Figure 7:
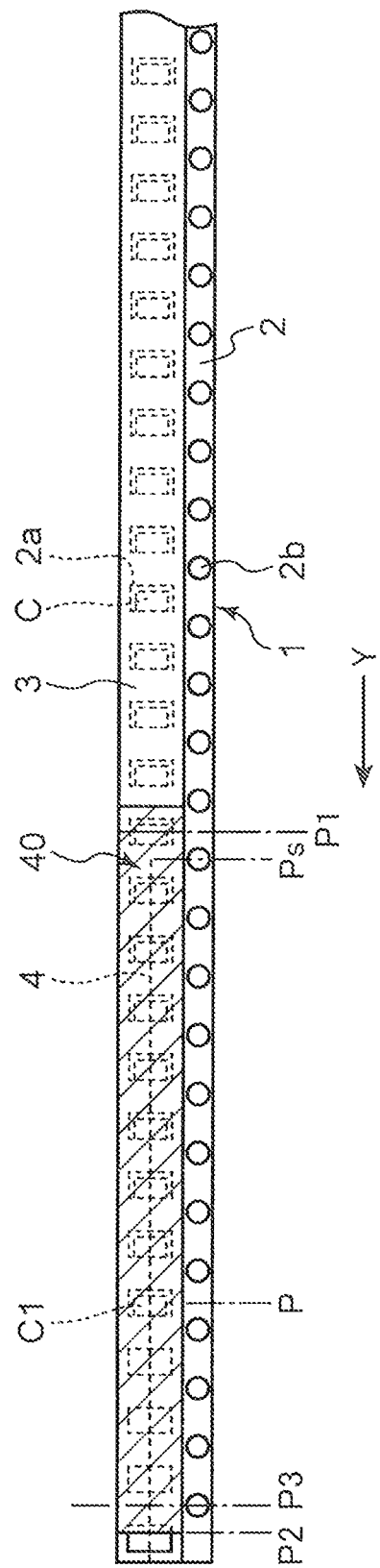
FIG. 7 is a plan view illustrating one example of the component supplying tape to which a repair tape is adhered.

At first, when the component supplying tape 1 (the reel 11) presently used in the tape feeder 10 is replaced, as shown in FIG. 7, the cover tape 3 at the both sides of a cutting line 4 is fixed by a repair tape 40 by adhering the repair tape 40 on the upper surface of the cover tape 3 along the cutting line 4 after returning the cut open portion of the cover tape 3 to the original shape, namely, after returning the expanded portion to an original closing state. With this, the component supplying tape 1 is repaired to a state in which the component storing portion 2a in the section between the cutting start position Ps and the component take out position P is covered by the cover tape 3 (a state in which the component C is covered by the cover tape 3 again) (step of repairing the component supplying tape).

In the example shown in FIG. 7, the repair tape 40 is adhered over the section of the cover tape 3 between a first position P1 far away from the cutting start position Ps toward the upstream side and a second position P2 far away from both of the first position P1 and the component take out position P toward the downstream side. The first position P1 corresponds to a position of an approximately center of the first component storing portion 2a located far away from the cutting start position Ps toward the upstream side. The second position P2 corresponds to any position appropriately far away from a cut position P3 described below toward the downstream side.

Figure 8:
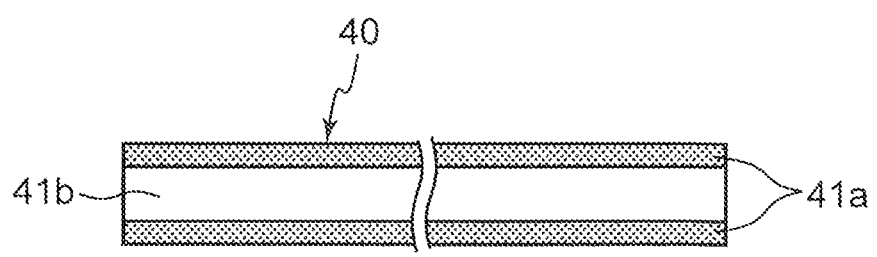
FIG. 8 is a plan view illustrating one example of the repair tape.

As shown in FIG. 8, the repair tape 40 is formed by a strip like tape formed of a transparent or semitransparent resin film having a width substantially the same as a width of the cover tape 3, preferably formed of a resin film equivalent to the cover tape 3. The repair tape 40 has adhesive portions 41a extending in the longitudinal direction on one surface of the repair tape 40 at both sides in the width direction of the surface, and therefore a non-adhesive portion 41b is provided between the adhesive portions 41a. An interval of the adhesive portions 41a (a width of the non-adhesive portion 41b) is set to be appropriately larger than a width of the component storing portion 2a. Accordingly, the adhering of the repair tape 40 to the cover tape 3 is performed by covering the component storing portion 2a by the non-adhesive portion 41b.

After the repair tape 40 is adhered, the component supplying tape 1 is cut together with the repair tape 40 at the predetermined cut position P3 (step of cutting the component supplying tape).

The cut position P3 corresponds to a position defined based on a position of the component C located at the head of the component supplying tape 1 (a component located at the most downstream side in the conveying direction, hereinafter, referred to as a first component C1) among the components C remained in the component supplying tape 1. Specifically, the cut position P3 corresponds to a position far away from the position of the first component C1 toward the downstream side by a length for so-called idle driving. That is, in the tape feeder 10, a test driving which is so-called idle driving in which a predetermined feeding amount of the component supplying tape 1 is conveyed is performed after the reel is replaced and before the main driving in which the component supplying tape 1 is conveyed for supplying the component. The idle driving is formed to convey the component supplying tape 1 without taking out of the component C executed by the head 5. Thus, in order to avoid wasting the components C, the cut position P3 is defined as the position far away from the first component C1 toward the downstream side by the feeding amount of the idle driving. In the example shown in the figure, the cut position P3 is defined at a position between the third component storing portion 2a and the fourth component storing portion 2a counted from the component storing portion 2a in which the first component C1 is stored.

Further, the component supplying tape 1 (the reel 11) cut at the cut position P3 as described above is stored and reused in the tape feeder 10 as needed. In this case, the reel 11 is set to the tape holder 12, and the component supplying tape 1 is set in the conveying device 14 by drawing the cut position P3 of the component supplying tape 1 as the head portion from the reel 11 along a predetermined path. With this, the component supplying tape 1 can be reused in the tape feeder 10.

According to the tape processing method above, since the component supplying tape 1 can be stored in a state in which the component storing portion 2a is covered by the cover tape 3 like the original state, the component C remained in the cut open portion of the cover tape 3 is prevented from dropping off when the component supplying tape 1 is stored or reused. Accordingly, the component supplying tape 1 can be reused without wasting the components C.

Especially, according to the tape processing method described above, since the component supplying tape 1 is cut at the cut position P3 set to the downstream position by the feeding amount of the idle driving in cutting the component supplying tape 1, the component C is not wasted due to the idle driving of the tape feeder 10 when the component supplying tape 1 is reused. Accordingly, the component supplying tape 1 can be reused without wasting the components C also in this respect.

Further, according to the tape processing method described above, since the repair tape 52 is adhered to the region toward the upstream side from the position (the second position P2) far away from the cut position P3 toward the downstream side in the component supplying tape 1, when the component supplying tape 1 is cut, the repair tape 52 is cut together with the component supplying tape 1. With this, an end portion (a head portion) of the component supplying tape 1 and an end portion of the repair tape 52 are flush with each other after cutting. That is, the end portion (the head portion) of the component supplying tape 1 after cutting can be set to the same state as that of the component supplying tape 1 in which the cover tape 3 is unopened. Accordingly, when the component supplying tape 1 is reused, the head portion of the component supplying tape 1 is set to the conveying device 14 as it is so as to be conveyed, and therefore the cover tape 3 can be cut open similar to a new component supplying tape 1 by using the opening device 16.

Further, according to the tape processing method described above, since the transparent or semitransparent repair tape 40 is used, the existence of the component C or the position of the component storing portion 2a can be seen from the outside without difficulty after adhering the repair tape 40. Thus, when the component supplying tape 1 is cut, the cut position P3 can precisely specified by firmly checking the position of the first component C1 or the position of the component storing portion 2a.

Further, according to the tape processing method described above, since the repair tape 40 having the adhesive portion 41a at only the both ends in the width direction is adhered to the cover tape 3 such that the adhesive portions 41a are located at the both sides of the component storing portion 2a respectively, the component C can be prevented from adhering to the repair tape 40 through the cut open portion of the cover tape 3.

Next, a tape repair member suitable for the tape processing method described above will be described.

Figure 9:
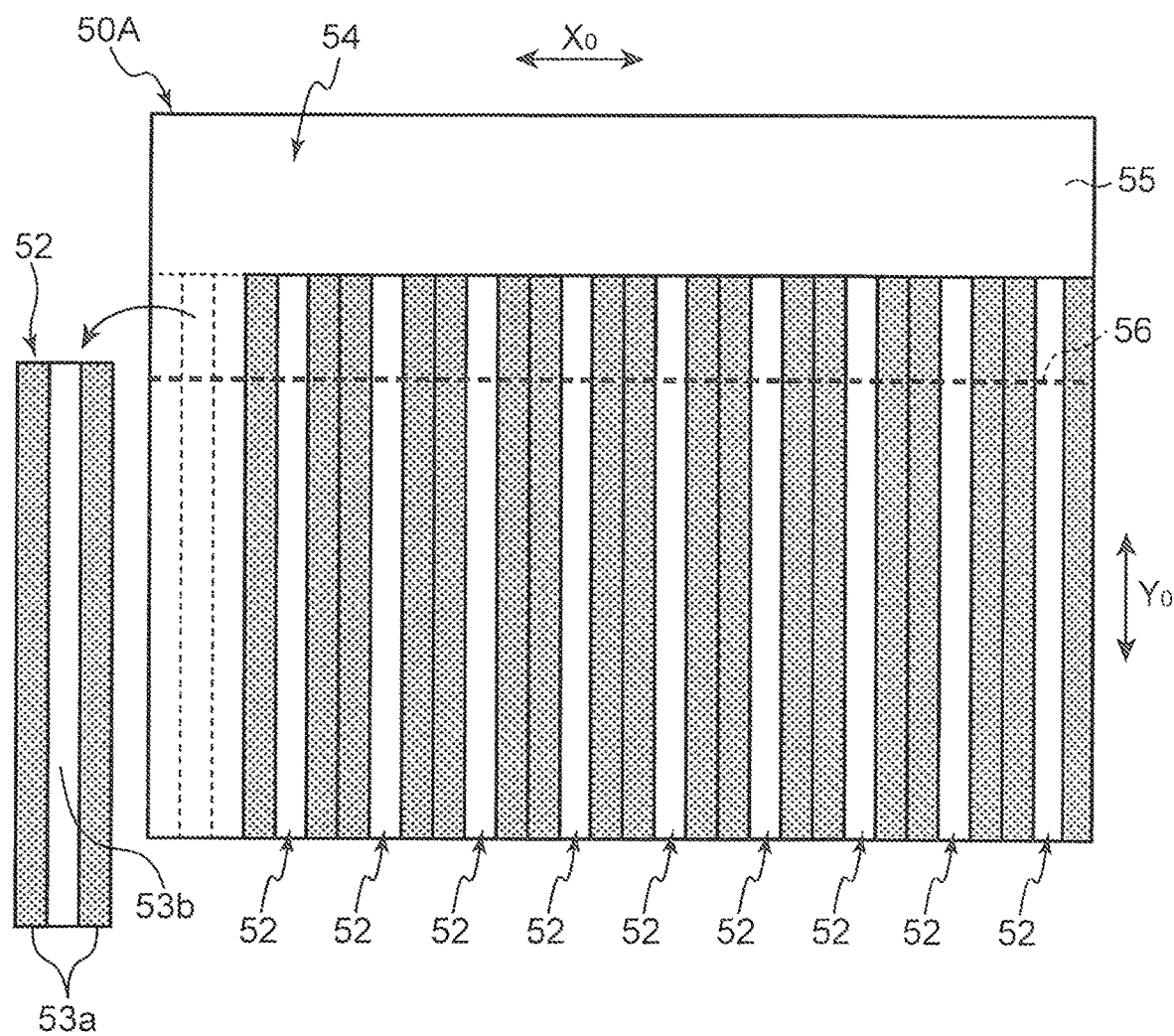
FIG. 9 is a plan view illustrating a tape repair member (first embodiment)

FIG. 9 is a plan view illustrating the tape repair member according to the first embodiment. FIG. 10A is a side view of the tape repair member. The tape repair member 50A shown in FIG. 9 and FIG. 10A includes a plurality of repair tapes 52 which can be adhered to the cover tape 3, and a sheet like member 54 to which the repair tape 52 is adhered in a peelable manner in a state in which the adhesiveness of the repair tape 52 is kept.

The repair tape 52 has a similar configuration to that of the repair tape 40 described above (see FIG. 8). That is, the repair tape 52 is formed by a strip like tape formed of a transparent or semitransparent resin film. The repair tape 52 has adhesive portions 53a on one surface of the repair tape 52 at both sides in the width direction of the surface extended in the longitudinal direction, and therefore a non-adhesive portion 53b is provided between the adhesive portions 53a. A width of the repair tape 52 is set to substantially the same as the width of the cover tape 3. A length of the repair tape 52 (a size in the longitudinal direction) is set to substantially the same as a distance between the first position P1 and the second position P2 described above.

The sheet like member 54 is formed of a thick paper having a rectangular shape in a plan view on which a releasing agent is coated. A plurality of the repair tapes 52 is adhered to the sheet like member 54 in a peelable manner. In the example shown in the figure, ten sheets of the repair tapes 52 are adhered in parallel such that short sides of the repair tapes 52 are aligned along a long side of the sheet like member 54. As shown in the figure, a width of the sheet like member 54 (a size in the lateral direction of FIG. 9) is similar to the total width of the ten sheets of the repair tapes 52, and a length of the sheet like member 54 (a size in the vertical direction of FIG. 9) is longer than a length in the longitudinal direction of the repair tape 52. With this, in the sheet like member, an extended portion 55 extended toward the outside in the longitudinal direction from the end portion of each of the repair tapes 52 is formed. Further, a folded portion 56 extended in a second direction $X_0$ corresponding to the width direction of the repair tape 52, is formed in a region in which the repair tapes 52 are adhered in the sheet like member 54, at a position closer to one end of the repair tape 52 in a first direction $Y_0$ corresponding to the longitudinal direction of the repair tape 52. In other words, each of the repair tapes 52 is adhered to the sheet like member 54 so as to cross the folded portion 56. The folded portion 56 is formed by, for example, a perforation or a V-shape groove. With this, as shown in FIG. 10B, the extended portion 55 can be folded easily toward other portion.

A usage method of the tape repair member 50A is described below. That is, when the component supplying tape 1 (the reel 11) presently used in the tape feeder 10 is replaced, the repair tape 52 is peeled from the sheet like member 54 and adhered to an upper surface of the cover tape 3. With this, the component supplying tape 1 can be repaired into a state in which the component storing portion 2a is covered by the cover tape 3. Further, an adhering position and an adhering method thereof are similar to the adhering position and the adhering method of the repair tape 40 described in the tape processing method described above.

Further, when the repair tape 52 is peeled from the sheet like member 54, as shown in FIG. 10B, the one end portion of the repair tape 52 is peeled from the sheet like member 54 after bending the extended portion 55 of the sheet like member 54 along the folded portion 56 and then peeling the one end portion to release the repair tape 52 from the sheet like member 54, the repair tape 52 can be easily peeled from the sheet like member 54.

According to the tape repair member 50A, when the component supplying tape 1 (the reel 11) presently used in the tape feeder 10 is replaced, by peeling the repair tape 52 from the sheet like member 54 and adhering the repair tape 52 to the cover tape 3, the tape processing described above can be performed. That is, since the length of the repair tape 52 (the size in the longitudinal direction) is set to be equal to the distance between the first position P1 and the second position P2, an operator can adhere the repair tape 52 appropriately to a necessary region by adhering the one end in the longitudinal direction of the repair tape 52 to the cover tape 3 so as to be matched with the first position P1 (the center of the first component storing portion 2a located far away from the cutting start position Ps toward the upstream side) of the component supplying tape 1. Thus, operation for adhering the repair tape to the cover tape 3 while cutting the repair tape in an appropriate length is not necessary, and therefore the tape processing can be performed easily and quickly and the quality thereof can be kept stably.

Next, a tape repair member according to a second embodiment will be described. Further, in the description below, the same reference sign is assigned to the same component as the tape repair member 50A according to the first embodiment, and therefore a difference between the tape repair member according to the second embodiment and the tape repair member 50A according to the first embodiment is mainly described (this is similar to a third embodiment described below).

Figure 11A:
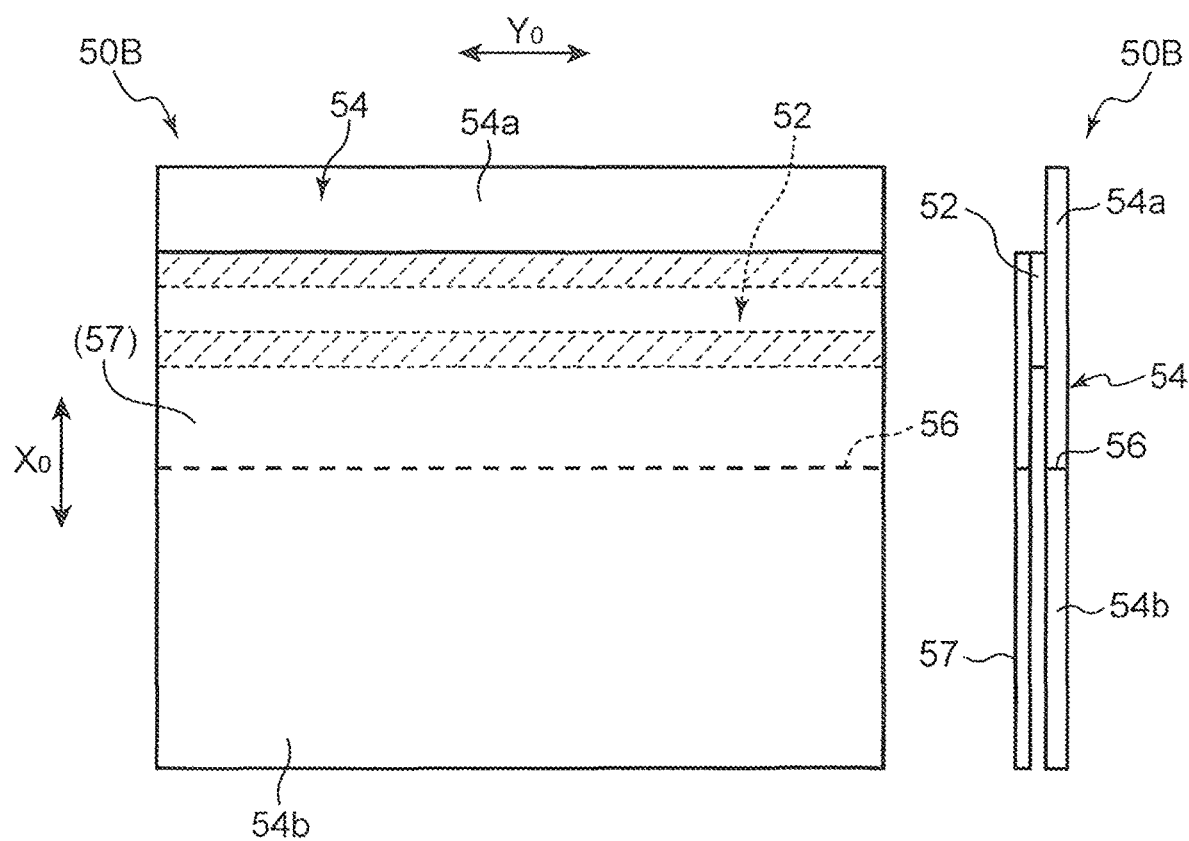
FIG. 11A is a plan view illustrating a tape repair member (second embodiment)

FIG. 11A is a plan view of a tape repair member according to the second embodiment. 11B is a side view of the tape repair member. The tape repair member 50B shown in FIG. 11A and FIG. 11B includes a repair tape 52, a sheet like member 54 to which the repair tape 52 is adhered in a peelable manner, and a protection sheet 57 which protects the repair tape 52.

In the example shown in the figures, the sheet like member 54 is formed by a thick paper having a rectangular shape in a plan view. A length (a size in a vertical direction of FIG. 11A) of the sheet like member 54 is set to be larger than a width of the sheet like member 54. A folded portion 56 formed by a perforation or a V-shape groove extended in a long side direction is formed at a center in a short side direction of the sheet like member 54. With this, the sheet like member 54 is divided into a first sheet portion 54a and a second sheet portion 54b with respect to the folded portion 56 as a boundary. One repair tape 52 is adhered to the first sheet portion 54a in a peelable manner. That is, the sheet like member 54 includes the folded portion 56 extended to be parallel to a first direction $Y_0$ corresponding to a longitudinal direction of the repair tape 52, at a predetermined position in a direction parallel to a second direction $X_0$ corresponding to a width direction of the repair tape 52, and the first sheet portion 54a which can be folded with respect to the folded portion 56 as a boundary.

Further, the protection sheet 57 is adhered to the sheet like member 54 and the repair tape 52 in a peelable manner so as to sandwich the repair tape 52 together with the sheet like member 54. Further, in FIG. 11B, in order to clarify a configuration of the tape repair member 50B, the protection sheet 57 and the sheet like member 54 are illustrated in a separated manner (FIGS. 12A to 12C are similarly illustrated), however in the actual configuration, the protection sheet 57 and the sheet like member 54 are adhered to each other while intervening the repair tape 52.

The width of the sheet like member 54 is substantially equal to a size in the longitudinal direction (the first direction $Y_0$) of the repair tape 52. The repair tape 52 is adhered to the sheet like member 54 (the first sheet portion 54a) such that the long side of the repair tape 52 (the first direction $Y_0$) and the long side of the sheet like member 54 are parallel to each other.

Figure 11B:
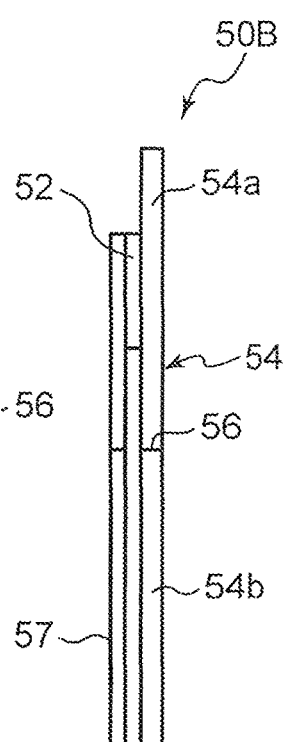
FIG. 11B is a side view of the tape repair member shown in FIG. 11(*a*)

The protection sheet 57 is a sheet having a rectangular shape in a plan view. One surface (a surface at a side of the repair tape 52) of the protection sheet 57 is set to an adhesive surface having slight adhesiveness. The protection sheet 57 is formed by, for example, a transparent resin sheet formed of polyethylene terephthalate or the like. As shown in FIG. 11B, the protection sheet 57 has a size that covers a whole of the second sheet portion 54b from a position of the repair tape 52. Further, adhesive power of the adhesive surface of the protection sheet 57 is lower than adhesive power of the adhesive surface (the adhesive portion 53a) of the repair tape 52.

A usage method of the tape repair member 50B is described below. That is, when the component supplying tape 1 (the reel 11) presently used in the tape feeder 10 is replaced, at first, as shown in FIG. 12A, the first sheet portion 54a is perpendicularly folded against the second sheet portion 54b (the protection sheet 57) at a position of the folded portion 56 while peeling the repair tape 52 from the first sheet portion 54a together with the protection sheet 57. Next, by contacting a surface of the first sheet portion 54a, namely a surface on which the repair tape 52 is adhered, with a side surface of the component supplying tape 1 and moving the whole of the tape repair member 50B along the side surface, one end in the longitudinal direction of the repair tape 52 is positioned at the first position P1 (the center of the first component storing portion 2a located far away from the cutting start position Ps toward the upstream side) of the component supplying tape 1 (see FIG. 12B). In this state, the repair tape 52 is pressed against the cover tape 3 together with the protection sheet 57. With this, the repair tape 52 is adhered to the cover tape 3. Further, in the tape repair member 50B, a length between the folded portion 56 and the repair tape 52 is set such that the repair tape 52 is automatically overlapped with the cover tape 3 when the first sheet portion 54a is perpendicularly folded against the second sheet portion 54b (the protection sheet 57) and the surface of the first sheet portion 54a is contacted with the side surface of the component supplying tape 1. Accordingly, as described above, by pressing the repair tape 52 against the cover tape 3 together with the protection sheet 57 in a state in which the surface of the first sheet portion 54a is contacted with the side surface of the component supplying tape 1, the repair tape 52 can be adhered to the cover tape 3.

Further, at last, as shown in FIG. 12C, by peeling the protection sheet 57 from the repair tape 52, the adhering of the repair tape 52 to the cover tape 3 is completed. Further, as described above, since the adhesive power of the adhesive surface of the protection sheet 57 is lower than the adhesive power of the adhesive surface (the adhesive portion 53a) of the repair tape 52, the protection sheet 57 can be easily peeled from the repair tape 52 by picking up the protection sheet 57.

Also in such a tape repair member 50B, the repair tape 52 can be adhered appropriately to a necessary region by adhering the one end in the longitudinal direction of the repair tape 52 to the cover tape 3 so as to be matched with the first position P1 of the component supplying tape 1. Consequently, similar to the tape repair member 50A of the first embodiment, the tape processing described above can be performed easily and quickly and the quality thereof can be kept stably. Especially, according to the tape repair member 50B of the second embodiment, the repair tape 52 is automatically positioned to the cover tape 3 in the width direction by perpendicularly folding the first sheet portion 54a of the sheet like member 54 and contacting the surface of the first sheet portion 54a with the side surface of the component supplying tape 1, and thereby the repair tape 52 can be preferably adhered to the cover tape 3 without generating positional deviation of the repair tape 52 against the cover tape 3 in the width direction.

Next, a tape repair member according to a third embodiment will be described.

FIG. 13A is a plan view illustrating a repair tape of a tape repair member according to the third embodiment. FIG. 13B is a plan view illustrating a component supplying tape (a standard size tape 1a described below) to which the repair tape is adhered.

A basic configuration of a tape repair member 50C according to the third embodiment is the same as the configuration of the tape repair member 50A according to the first embodiment. However, a positional information display 60 is shown on the repair tape 52, and this is the difference from the configuration of the tape repair member 50A of the first embodiment.

The positional information display 60 indicates the cut position P3 when the repair tape 52 is adhered to the component supplying tape 1. In this example, three displays 61a to 61c (they are referred to as a first display 61a, a second display 61b, and a third display 61c respectively as needed) corresponding to four kinds of the component supplying tapes 1 are shown. Specifically, the first display 61a indicates the cut position P3 of the component supplying tape 1 in which the components C having a standard size are stored at pitches of 4 mm (it is referred to as a standard size tape 1a). The second display 61b indicates the cut position P3 of the component supplying tape 1 in which the large components C larger than the component having the standard size are stored at pitches of 4 mm (it is referred to as a large size tape 1b, see FIG. 14A). The third display 61c indicates the cut position P3 of the component supplying tape 1 in which the small components C smaller than the component C having the standard size are stored at pitches of 2 mm (it is referred to as a small size tape 1c, see FIG. 14B) and the component supplying tape 1 in which the micro components C smaller than the component C having the small size are stored at pitches of 1 mm (it is referred to as a micro size tape, not shown).

In a state in which the repair tape 52 is adhered to the component supplying tape 1, the second display 61b is located at the downstream side of the first display 61a, and the third display 61c is located at the upstream side of the first display 61a. Each of the displays 61a to 61c includes a line display 62 indicating the cut position P3 and a character display 63 indicating the pitches of the components C. Further, since the cut position P3 of the small size tape 1c and the cut position of the micro size tape are substantially the same to each other, the third display 61c includes the one single line display 62 indicating the cut position P3 and the character displays 63 respectively indicating the respective pitches of the two kinds of the components C.

A usage method of the tape repair member 50C is similar to the usage method of the tape repair member 50A of the first embodiment, and the repair tape 52 is peeled from the sheet like member 54 and then the repair tape 52 is adhered to the upper surface of the cover tape 3.

Specifically, as shown in FIG. 13B, an adhering direction of the repair tape 52 is set such that the character display 63 can be read from a side of the feeding hole 2b in a state in which the repair tape 52 is adhered to the component supplying tape 1. Accordingly, the repair tape 52 is adhered to the cover tape 3 such that one end portion in the longitudinal direction of the repair tape 52 (a right end in FIG. 13A) is matched with the first position P1 of the component supplying tape 1 in accordance with the adhering direction. In this state, the component supplying tape 1 is cut in accordance with the positional information display 60 (61a to 61c). In this figure, since the repair tape 52 is adhered to the standard size tape 1a, the standard size tape 1a may be cut along the line display 62 of the first display 61a corresponding to the standard size tape 1a.

FIG. 14A illustrates an example in which the repair tape 52 is adhered to the large size tape 1b. FIG. 14B illustrates an example in which the repair tape 52 is adhered to the small size tape 1c. The component supplying tapes 1 (1b, 1c) may be cut at a position of the second display 61b corresponding to the large size tape 1b in a case shown in FIG. 14A and at a position of the third display 61c corresponding to the small size tape 1c in a case shown in FIG. 14B, respectively.

According to such a tape repair member 50C, since the positional information display 60 (61a to 61c) of the cut position P3 is shown on the repair tape 52, after the repair tape 52 is adhered to the component supplying tape 1 (1a to 1c or the like), the component supplying tape 1 can be cut while recognizing the position of the cut position P3 easily and quickly. Thus, the workability of cutting the component supplying tape is improved.

Especially, according to the tape repair member 50C described above, one single tape repair member 50C can be commonly used for the four kinds of the component supplying tapes 1 (1a to 1c or the like) of the large size, the standard size, the small size, and the micro size, and thereby it is not necessary to independently use the tape repair members in accordance with the kinds of the component supplying tape 1.

Further, the repair tape 52 is configured such that the positional information display 60 (61a to 61c) shows the correct cut position P3 when the repair tape 52 is adhered to the component supplying tape 1 such that the character display 63 can be read from the side of the feeding hole 2b, however in some case, an operator might erroneously adhere the repair tape 52 in an opposite direction (in FIG. 13B, in a right-left reversed direction). Thus, in order to avoid such erroneous operation, as shown by, for example, a dashed line in FIG. 13A, a reference information display 65 which indicates a reference position for adhering the repair tape 52 such as a triangle display and an arrow display may be further shown on the repair tape 52.

The tape processing method and the tape repair members 50A to 50C used in the tape processing method of the present disclosure are described above, however the tape processing method and the tape repair members 50A to 50C exemplary show preferable embodiments of the tape processing method and the tape repair member according to the present disclosure, and the method and the configuration thereof can be appropriately modified within the subject matter of the present disclosure. For example, the modification described below can be adopted.

In the tape processing method described above, the repair tape 40 (52) is adhered to the section between the first position P1 far away from the cutting start position Ps toward the upstream side and the second position P2 far away from the component take out position P toward the downstream side of the cover tape 3 (see FIG. 7), however the repair tape 40 may be adhered to at least a region between the cut position P3 and the position of the first component C1. That is, in the region between the cut position P3 which is the head portion of the component supplying tape 1 in reusing and the position of the first component C1, by fixing the cover tape 3 arranged at the both sides of the cutting line 4 by using the repair tape 40 after returning the cut open portion of cover tape 3 to the original state, even if the repair tape 40 is not adhered to a region upstream of the region described above, as shown in FIG. 15, the upstream side cover tape 3 follows the downstream side cover tape 3 to some extent, and thereby the component storing portion 2a (the component C) is covered by the cover tape 3. Accordingly, although it is preferable that the repair tape 40 is adhered to a wide region as shown in FIG. 7 in order to prevent the component C from dropping off, the component C can be prevented from dropping off by adhering the repair tape 40 to at least the region between the cut position P3 and the first component C1.

Further, in the embodiments described above, the tape processing method in which the component supplying tape 1 presently used in the tape feeder 10, which cuts open the center of the cover tape 3 along the longitudinal direction of the cover tape 3, is reused, and the tape repair member suitable for the tape processing method are described. However, the tape processing method of the present disclosure may be applied to a case in which the component supplying tape 1 presently used in a tape feeder 10, which opens the cover tape 3 from one side, namely the tape feeder 10 which includes a cutter 28 having a flat shape to be arranged between the cover tape 3 and the carrier tape 2 and, as shown in FIGS. 16A to 16C, opens the component supplying portion 2a while peeling only the one end portion in the width direction of the cover tape 3 from the carrier tape 2 by using the cutter 28 in accordance with the conveying of the component supplying tape 1, is reused. In this case, the cover tape 3 may be fixed to the carrier tape 2 by the repair tape after returning the cover tape 3 opened from the one side into the original state, and then the component supplying tape 1 may be cut at a predetermined cut position P3 far away from the first component C1 toward the downstream side.

Figure 17A:
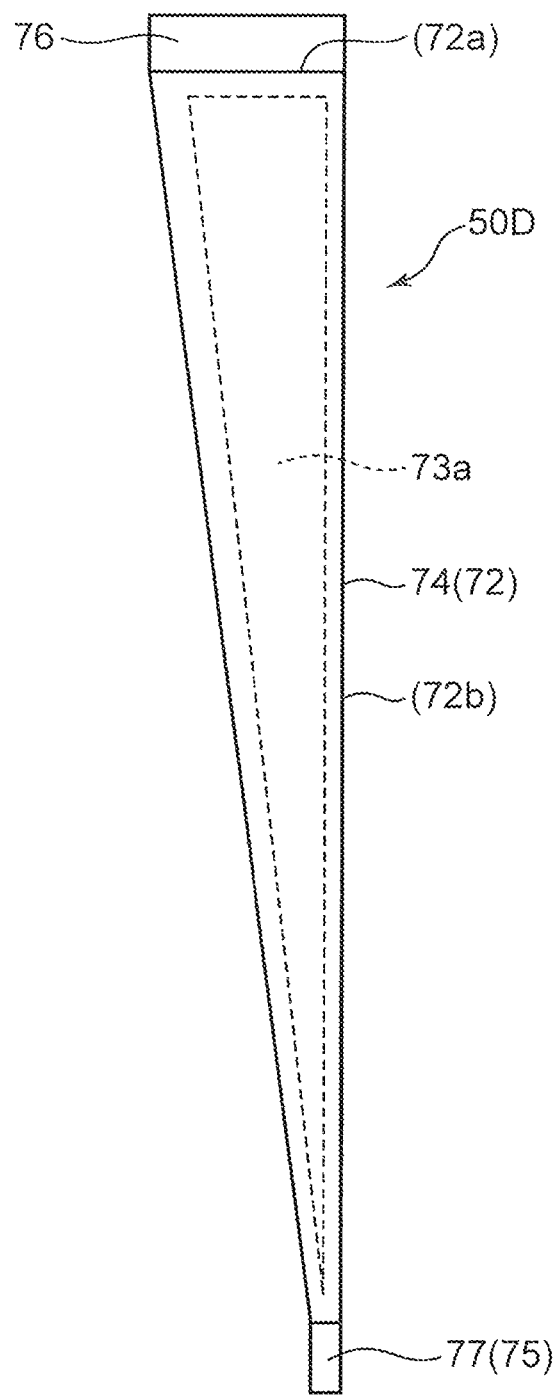
FIG. 17A is a plan view illustrating the tape repair member.
Figure 17B:
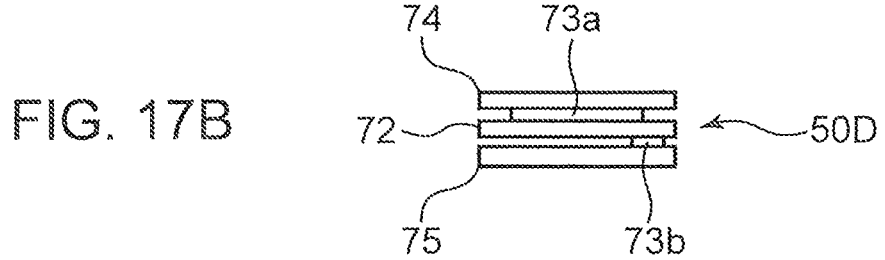
FIG. 17B is a front view of the tape repair member shown in FIG. 17A.

FIGS. 17A and 17B illustrate a tape repair member 50D suitable for the tape processing of the component supplying tape 1 opened from the one side as described above. FIG. 17A is a plan view and FIG. 17B is a front view, and each figure schematically illustrates the tape repair member 50D. As shown in figures, the tape repair member 50D includes a repair tape 72, and a pair of sheet like members 74, 75 adhered to both sides of the repair tape 72 in a peelable manner so as to intervene the repair tape 72. The repair tape 72 is formed of an elongated tape having a right angled triangular shape in a plan view formed of a transparent or semitransparent resin film equivalent to the cover tape 3. The repair tape 72 includes a front side adhesive portion 73a on a front surface thereof (an upper surface in FIG. 17B corresponding to a first adhesive portion in the present disclosure) and a rear side adhesive portion 73b on a rear surface thereof (corresponds to a second adhesive portion in the present disclosure). The front side adhesive portion 73a is formed in a similar figure (a right angled triangle) to the repair tape 72 in a plan view, and the rear side adhesive portion 73b is formed in an elongated rectangular shape along an adjacent side 72b extended in a longitudinal direction of the repair tape 72. The rear side adhesive portion 73b is formed only on one end portion in a width direction (a lateral direction of FIG. 17A) of the repair tape 72. Here, in this example, in the repair tape 72, an adjacent side 72a extended in the width direction corresponds to a first adjacent side of the present disclosure and the adjacent side 72b along the longitudinal direction corresponds to a second adjacent side of the present disclosure.

A pair of the sheet like members 74, 75 is formed of a resin sheet having a right angled triangular shape in a plan view substantially equivalent to the repair tape 72. In those sheet like members 74, 75, the front side sheet like member 74 adhered to the front surface of the repair tape 72 includes a pick-up portion 76 extended toward an outside from one end of the repair tape 72 in the longitudinal direction, and the rear side sheet like member 75 adhered to the rear surface of the repair tape 72 includes a pick-up portion 77 protruded toward the outside from another end of the repair tape 72 in the longitudinal direction.

Here, in FIG. 17B, in order to clarify a configuration of the tape repair member 50D, gaps are provided between the sheet like members 74, 75 and the repair tape 72, however in the actual configuration, the sheet like members 74, 75 and the repair tape 72 are adhered to each other.

A usage method of the tape repair member 50D is described below.

Figure 18B:
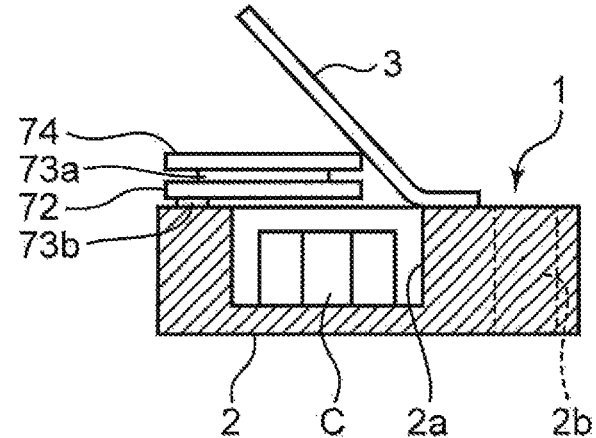
FIG. 18B is a view for describing a usage method of the tape repair member (a cross-sectional view of the component supplying tape illustrating a state in which the repair tape is adhered to a carrier tape)
Figure 19:
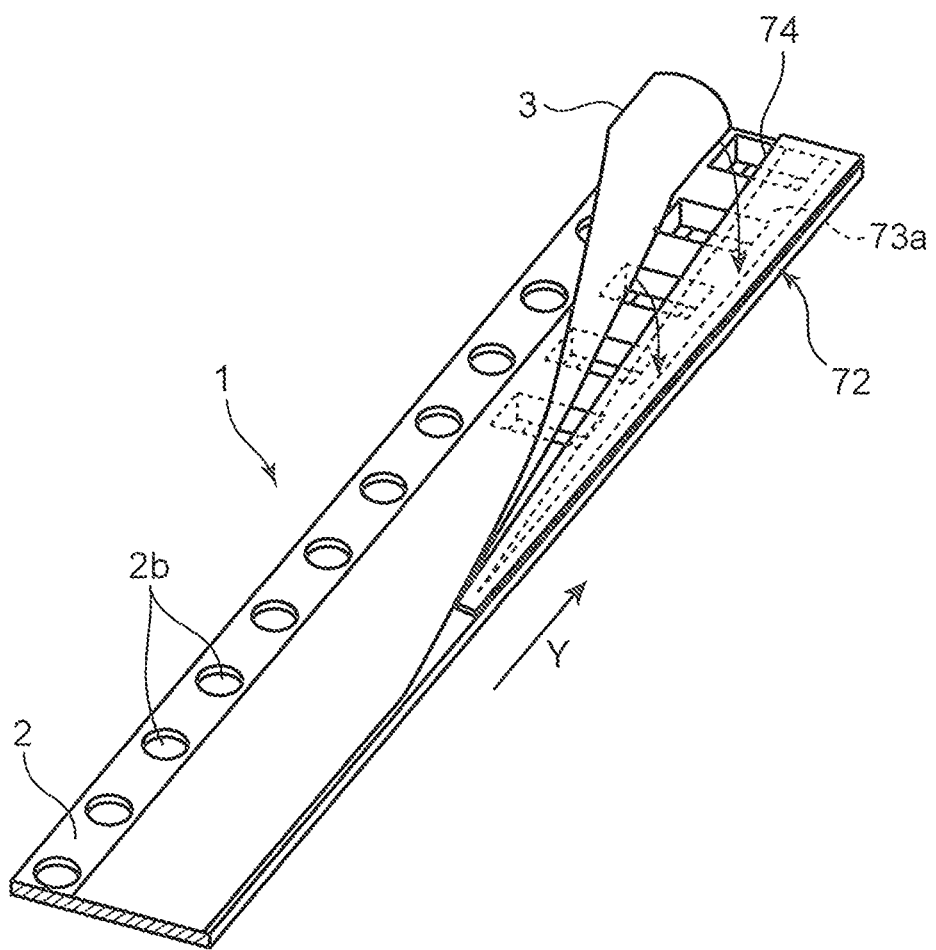
FIG. 19 is a perspective view of the component supplying tape illustrating a state in which the repair tape is adhered to the carrier tape.

At first, by picking up the pick-up portion 77, as shown in FIG. 18A, the rear side sheet like member 75 is peeled from the repair tape 72, and then as shown in FIG. 18B and FIG. 19, the repair tape 72 is adhered to the upper surface of the cover tape 3 together with the front side sheet like member 74. Specifically, the repair tape 72 is adhered to the carrier tape 2 by using the rear side adhesive portion 73b in a state in which a sharp end of the repair tape 72 is directed to the upstream side and the adjacent side 72b is arranged along a side edge portion of the carrier tape 2. Here, the position of the rear side adhesive portion 73b in the repair tape 72 is set such that the rear side adhesive portion 73b is automatically positioned at an adhering position of the original cover tape 3 of the carrier tape 2 when the adjacent side 72b of the repair tape 72 is arranged along the side edge portion of the carrier tape 2.

Figure 18C:
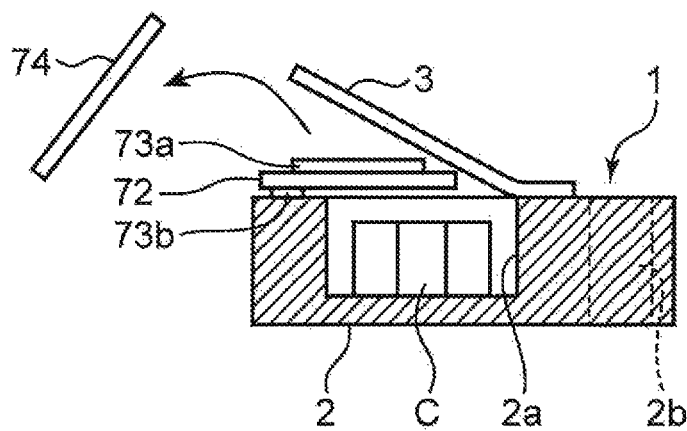
FIG. 18C is a view for describing a usage method of the tape repair member (a cross-sectional view of the component supplying tape illustrating a state in which a front side sheet like member is peeled from the repair tape)
Figure 18D:
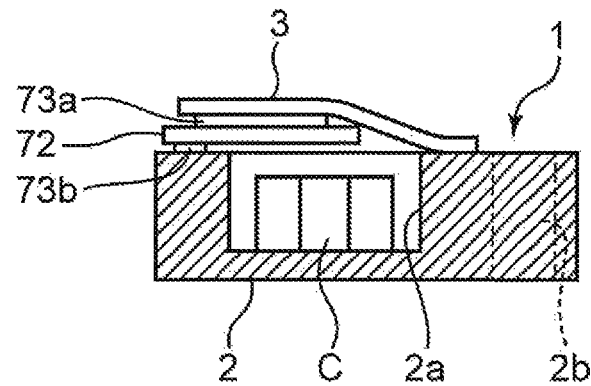
FIG. 18D is a view for describing a usage method of the tape repair member (a cross-sectional view of the component supplying tape illustrating a state in which the cover tape is fixed to the carrier tape via the repair tape)

Next, by picking up the pick-up portion 76, as shown in FIG. 18C, the front side sheet like member 74 is peeled from the repair tape 72. And then, by pressing the cover tape 3 to the front side adhesive portion 73a, as shown in FIG. 18D, the cover tape 3 is fixed to the carrier tape 2 via the repair tape 72. With this, the component supplying tape 1 is repaired to a state in which the component storing portion 2a is covered by the cover tape 3.

Here, the tape repair member 50D described above is one example of the tape repair member suitable for repairing the component supplying tape 1 opened from one side, and the shape thereof may be modified appropriately. For example, the configuration of the tape repair member 50D may be configured to be similar to the basic configuration of any one of the tape repair members 50A to 50C according to the first to third embodiments described above (for example, the configuration of having the positional information display).

The present disclosure described above will be summarized below.

That is, the tape processing method according to one aspect of the present disclosure includes a tape processing method of reusing an opened component supplying tape used in a tape feeder which conveys a component supplying tape having a strip shape and provided with a carrier tape including a plurality of component storing portions in which a component is stored in a row and a cover tape adhered to the carrier tape to cover the component storing portion, toward a component take out position, the tape feeder being configured to open a cover tape at a position far away toward an upstream side from the component take out position in a conveying direction while keeping an adhering state of the cover tape to the carrier tape and conveying the component supplying tape. The tape processing method includes a step of repairing the component supplying tape by closing an opened portion of the cover tape and fixing by a repair tape to be returned to a state in which the component storing portion is covered by the cover tape, and a step of cutting the component supplying tape at a predetermined cut position far away toward a downstream side in the conveying direction from a position of a head component located at the most downstream side in the conveying direction.

According to such a tape processing method, since the component supplying tape can be stored in a state in which the component supplying portion is covered by the cover tape and then reused, the component supplying tape can be reused while preventing the component remained in the opened portion from dropping off. Accordingly, the component supplying tape can be reused without wasting the component.

Here, "to open a cover tape while keeping an adhering state of the cover tape to the carrier tape" denotes that to open the cover tape without completely peeling the cover tape from the carrier tape, which includes a case in which the cover tape is cut open and a case in which the cover tape is opened from one side by peeling one end portion of the cover tape in the width direction from the carrier tape.

In the tape processing method described above, it is preferable that the step of repairing the component supplying tape, the repair tape is adhered in at least a region between the cut position and the position of the head component.

That is, by fixing the region closer to the cut position in the cover tape by using the repair tape, the upstream side (the upstream side in the conveying direction) of the cover tape is apt to follow the region descried above. Thus, according to the method for adhering the repair tape in the region described above, a state in which the component storing portion is covered by the cover tape is kept preferably.

In this case, it is preferable that the step of repairing the component supplying tape, the repair tape is adhered in a region toward an upstream side from a predetermined position far away from the cut position toward a downstream side in the conveying direction.

According to this method, in the step of cutting the component supplying tape, the repair tape is cut together with the component supplying tape and an end portion (a head portion) of the component supplying tape and an end portion of the repair tape are flush with each other after cutting. That is, the end portion (the head portion) of the component supplying tape after cutting can be set to the same state as that of the component supplying tape in which the cover tape is unopened.

Further, in the tape processing method descried above, it is preferable that the step of repairing the component supplying tape, a transparent or semitransparent repair tape is used.

According to this method, the existence of the component in the component storing portion can be seen without difficulty from the outside after adhering the repair tape. Thus, for example, in a case in which the cut position of the component supplying tape is recognized with respect to the position of the remaining head component, the recognition can be performed precisely.

Further, in a case in which the tape feeder executes test driving which conveys the component supplying tape by a predetermined feeding amount before executing main driving which conveys the component supplying tape for supplying the component, it is preferable that in the step of cutting the component supplying tape, the component supplying tape is cut at the cut position defined by a position far away from the position of the head component toward the downstream side in the conveying direction by the feeding amount.

According to this method, when the component supplying tape is reused, the component can be prevented from being wasted due to the test driving of the tape feeder.

Further, in the tape processing method described above, it is preferable that in the step of repairing the component supplying tape, the repair tape is adhered in which a positional information display indicating the cut position is shown in advance, to the cover tape.

According to this method, when the component supplying tape is cut in the step of cutting the component supplying tape, by cutting the component supplying tape in accordance with the positional information display shown on the repair tape, the component supplying tape can be cut easily and precisely. Thus, the workability of the step of cutting the component supplying tape is improved.

Further, in a case in which the tape feeder opens the cover tape by cutting open the cover tape along a longitudinal direction of the cover tape in association with the moving of the component supplying tape and by expanding the cover tape to both sides in a width direction, it is preferable that in the step of repairing the component supplying tape, the repair tape is adhered to the cover tape along a cut open line after returning a cut open portion of the cover tape to an original state.

According to this method, the component supplying tape in which the cover tape is cut open can be preferably stored in a state in which the component storing portion is covered by the cover tape and then reused.

Further, in a case in which the tape feeder opens the cover tape from one side by peeling only one end portion in a width direction of the cover tape from the carrier tape in association with the moving of the component supplying tape, by fixing the cover tape to the carrier tape by using the repair tape such that the opened portion is closed, the component supplying tape can be similarly reused.

On the other hand, a tape repair member according to one aspect of the present disclosure used in the tape processing method described above includes a repair tape having a strip shape configured to be adherable to the cover tape, and a sheet like member to which the repair tape is adhered in a peelable manner in a state in which the adhesiveness thereof is kept. The repair tape includes adhesive portions only on one surface of the repair tape and at both sides in a width direction of the surface.

According to this tape repair member, by fixing the cover tape by peeling the repair tape from the sheet like member and adhering the repair tape to the component supplying tape, the component supplying tape can be repaired to a state in which the component storing portion is covered by the cover tape. Especially, since the repair tape has the adhesive portions only at the both sides in the width direction, for example, by adhering the repair tape to the cover tape such that the adhesive portions are located at both sides of the component storing portion, the component supplying tape can be repaired while preventing the component from adhering to the repair tape through the opened portion of the cover tape.

In the tape repair member described above, as a first direction is defined by a longitudinal direction of the repair tape, the sheet like member includes a folded portion at a predetermined position in the first direction extended in a second direction perpendicular to the first direction, or alternatively the sheet like member includes a folded portion at a predetermined position in a second direction perpendicular to the first direction extended in the first direction.

More specifically, it is preferable that the repair tape is adhered to the sheet like member so as to be across the folded portion.

According to this configuration, by folding the sheet like member at the position of the folded portion, the repair tape can be adhered to the component supplying tape in a state in which only a part of the repair tape is peeled from the sheet like member. Thus, the workability of adhering the repair tape is improved.

Further, in a case in which the sheet like member includes the folded portion at the predetermined position in the second direction perpendicular to the first direction extended in the first direction, the tape repair member may further include a protection sheet adhered to the sheet like member and the repair tape in a peelable manner so as to sandwich the repair tape together with the sheet like member, and the sheet like member may include a first sheet portion to be foldable with respect to the folded portion as a boundary, and the repair tape may be adhered to the first sheet portion such that a longitudinal direction of the repair tape is parallel to the folded portion.

According to this configuration, the repair tape can be adhered to the component supplying tape relatively easily by following the procedures described below. That is, the first sheet portion is folded perpendicularly against the second sheet portion at the position of the folded portion while peeling the repair tape from the first sheet portion together with the protection sheet. Next, in such a state, the repair tape is pressed against the cover tape while contacting the first sheet portion with the side surface of the component supplying tape (the carrier tape). At last, the protection sheet is peeled from the repair tape.

Further, in the tape repair member as described above, it is preferable that the folded portion is formed by a perforation.

According to this configuration, the sheet like member can be formed in a simple structure and can be folded by slight power without difficulty. Thus, the workability of adhering the repair tape is further improved.

On the other hand, the tape repair member according to another aspect of the present disclosure used in the tape processing method of the component supplying tape in which the cover tape is opened from one side includes a repair tape having a right angled triangular shape, the repair tape having a first adhesive portion which is formed to be adherable to the cover tape, on one side surface, and a second adhesive portion which is formed to be adherable to the carrier tape, on another side surface, and a pair of sheet like members adhered to both surfaces of the repair tape in a peelable manner in a state in which the adhesiveness thereof is kept.

According to this tape repair member, by fixing the cover tape by peeling the repair tape from the sheet like member and adhering the repair tape so as to be intervened between the cover tape and the carrier tape, the component supplying tape can be repaired to a state in which the component storing portion is covered by the cover tape.

In this case, it is preferable that the repair tape includes a first adjacent side adjacent to a subtense and a second adjacent side longer than the first adjacent side, and the second adhesive portion is arranged only an end portion of the repair tape along the second adjacent side.

According to this configuration, the cover tape can be adhered to the carrier tape at a position adjacent to the original adhering position.

Further, in the tape repair member described above, it is preferable that the repair tape is transparent or semitransparent.

According to this configuration, the existence of the component in the component storing portion can be seen without difficulty from the outside after adhering the repair tape. Thus, for example, in a case in which the cut position of the component supplying tape is recognized with respect to the position of the remaining head component, the recognition can be performed precisely.

Further, in the tape repair member, it is preferable that the repair tape includes a positional information display which indicates the cut position of the component supplying tape.

According to this configuration, when the component supplying tape is cut, by cutting the component supplying tape in accordance with the positional information display shown on the repair tape, the component supplying tape can be cut easily and precisely.

In this case, it is preferable that the repair tape includes a first positional information display corresponding to a first component supplying tape, and a second positional information display corresponding to a second component supplying tape in which an array pitch in the component storing portion is different from an array pitch in the first component supplying tape.

According to this configuration, one tape repair member can be used for both of the first component supplying tape and the second component supplying tape, and therefore usability thereof is improved.

The invention claimed is:

1. A tape processing method of reusing an opened component supplying tape used in a tape feeder which conveys the component supplying tape having a strip shape and provided with a carrier tape including a plurality of component storing portions in which a component is stored in a row and a cover tape adhered to the carrier tape to cover the component storing portion, toward a component take out position, the tape feeder being configured to open a cover tape at a position away toward an upstream side from the component take out position in a conveying direction while keeping an adhering state of the cover tape to the carrier tape and conveying the component supplying tape, the tape processing method comprising:
   repairing the component supplying tape by closing an opened portion of the cover tape and fixing by a repair tape to be returned to a state in which the component storing portion is covered by the cover tape; and
   cutting the component supplying tape at a predetermined cut position away toward a downstream side in the conveying direction from a position of a head component located at the most downstream side in the conveying direction.

2. The tape processing method according to claim 1, wherein, in the repairing the component supplying tape, the repair tape is adhered in at least a region between the cut position and the position of the head component.

3. The tape processing method according to claim 2, wherein, in the repairing the component supplying tape, a transparent or semitransparent repair tape is used.

4. The tape processing method according to claim 2, wherein, in the repairing the component supplying tape, the repair tape is adhered in a region toward an upstream side from a predetermined position away from the cut position toward a downstream side in the conveying direction.

5. The tape processing method according to claim 1, wherein, in the repairing the component supplying tape, a transparent or semitransparent repair tape is used.

6. The tape processing method according to claim 1, wherein:
   the tape feeder is configured to execute test driving which conveys the component supplying tape by a predetermined feeding amount before executing main driving which conveys the component supplying tape for supplying the component; and
   in the cutting the component supplying tape, the component supplying tape is cut at the cut position defined by a position away from the position of the head component toward the downstream side in the conveying direction by the feeding amount.

7. The tape processing method according to claim 1, wherein, in the repairing the component supplying tape, the repair tape is adhered in which a positional information display indicating the cut position is shown in advance, to the cover tape.

8. The tape processing method according to claim 1, wherein:
   the tape feeder is configured to open the cover tape by cutting open the cover tape along a longitudinal direction of the cover tape in association with the moving of the component supplying tape and by expanding the cover tape to both sides in a width direction; and
   in the repairing the component supplying tape, the repair tape is adhered to the cover tape along a cut open line after returning a cut open portion of the cover tape to an original state.

9. The tape processing method according to claim 1, wherein the tape feeder is configured to open the cover tape from one side by peeling only one end portion in a width direction of the cover tape from the carrier tape in association with the moving of the component supplying tape.

\* \* \* \* \*